(12) United States Patent
Kijima et al.

(10) Patent No.: US 10,636,957 B2
(45) Date of Patent: Apr. 28, 2020

(54) FILM STRUCTURE BODY, ACTUATOR, MOTOR AND METHOD FOR MANUFACTURING FILM STRUCTURE BODY

(71) Applicant: Advanced Material Technologies, Inc., Chiba (JP)

(72) Inventors: Takeshi Kijima, Chiba (JP); Yuuji Honda, Chiba (JP); Yasuaki Hamada, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 634 days.

(21) Appl. No.: 15/373,907

(22) Filed: Dec. 9, 2016

(65) Prior Publication Data

US 2017/0179367 A1 Jun. 22, 2017

(30) Foreign Application Priority Data

Dec. 18, 2015 (JP) .................................. 2015-247387

(51) Int. Cl.

| | | |
|---|---|---|
| *H01L 41/08* | (2006.01) | |
| *H02K 11/21* | (2016.01) | |
| *H02K 11/24* | (2016.01) | |
| *H02K 1/27* | (2006.01) | |
| *H02K 11/20* | (2016.01) | |
| *H01L 41/083* | (2006.01) | |
| *H01L 41/09* | (2006.01) | |
| *H01L 41/187* | (2006.01) | |
| *H01L 41/314* | (2013.01) | |
| *H02K 1/12* | (2006.01) | |
| *H02N 2/10* | (2006.01) | |

(52) U.S. Cl.
CPC .......... *H01L 41/081* (2013.01); *H01L 41/083* (2013.01); *H01L 41/09* (2013.01); *H01L 41/1876* (2013.01); *H01L 41/314* (2013.01); *H02K 1/12* (2013.01); *H02K 1/27* (2013.01); *H02K 1/278* (2013.01); *H02K 11/20* (2016.01); *H02K 11/21* (2016.01); *H02K 11/24* (2016.01); *H02N 2/10* (2013.01)

(58) Field of Classification Search
CPC .......... H01L 41/081; H01L 41/09; H02N 2/10
See application file for complete search history.

(56) References Cited

U.S. PATENT DOCUMENTS

| | | | | |
|---|---|---|---|---|
| 2009/0220779 | A1* | 9/2009 | Doerr | .................... C04B 35/472 |
| | | | | 428/336 |
| 2015/0236242 | A1* | 8/2015 | Ryu | .................... H01L 41/125 |
| | | | | 310/313 C |
| 2018/0026177 | A1* | 1/2018 | Sun | .................... G11C 11/22 |
| | | | | 365/158 |

FOREIGN PATENT DOCUMENTS

| | | |
|---|---|---|
| JP | 2014-169466 | 9/2014 |
| JP | 2014-170784 | 9/2014 |

* cited by examiner

*Primary Examiner* — J. San Martin
(74) *Attorney, Agent, or Firm* — Wenderoth, Lind & Ponack, L.L.P.

(57) ABSTRACT

To enhance properties of a ferromagnetic film formed on a substrate. One aspect of the present invention is a film structure body having a single crystal substrate, and a first ferromagnetic film oriented and formed on the single crystal substrate.

17 Claims, 18 Drawing Sheets

XRD PATTERN 1 OF $Fe_{0.96}-Pt_{0.04}$ (200)

XRD PATTERN 2 OF $Fe_{0.96}-Pt_{0.04}$ (200)

FILM STRUCTURE BODY, ACTUATOR, MOTOR AND METHOD FOR MANUFACTURING FILM STRUCTURE BODY

BACKGROUND OF THE INVENTION

Field of the Invention

The present invention relates to a film structure body, an actuator, a motor and a method for manufacturing a film structure body.

Background Art

There is known a film structure body having a piezoelectric film containing an epitaxially grown lead zirconate titanate (PZT), namely, $PbZr_xTi_{1-x}O_3$ ($0<x<1$) on a silicon (Si) substrate via an alignment film and an electroconductive film, as a film structure body having a substrate and a piezoelectric film formed on the substrate.

In Japanese Patent Laid-Open Publication No. 2014-169466 (Patent Document 1), there is disclosed a technology which has, in an alignment film substrate, a Si substrate having a (100) crystal plane, a (100) alignment film formed on the Si substrate by epitaxial growth, an electroconductive film formed on the alignment film by epitaxial growth, and a PZT film formed on the electroconductive film.

Furthermore, in Japanese Patent Laid-Open Publication No. 2014-170784 (Patent Document 2), there is disclosed a technology which has, in an alignment film substrate, a Si substrate having a (100) crystal plane, a (100) alignment film formed on the Si substrate by epitaxial growth, an electroconductive film formed on the alignment film by epitaxial growth and a PZT film formed on the electroconductive film.

When a such film structure body having a piezoelectric film is applied to, for example, an actuator, it is desirable to increase force that is received by the film structure body and that is other than force by an inverse piezoelectric effect in order to further increase displacement magnitude and displacement speed of the actuator. Furthermore, it is desirable to increase a piezoelectric constant of the piezoelectric film. Alternatively, when applying a film structure body having a piezoelectric film to a power unit that uses force other than force by an inverse piezoelectric effect, it is desirable to increase force that is received by the film structure body and that is other than force caused by an inverse piezoelectric effect, and to increase a piezoelectric constant of the piezoelectric film for detecting, by a piezoelectric effect, the force other than force caused by the inverse piezoelectric effect.

In addition, it is desirable to enhance properties of the ferromagnetic film, when forming a ferromagnetic thin film on a substrate.

DESCRIPTION OF A RELATED ART

Patent Document

[Patent Document 1] Japanese Patent Laid-Open Publication No. 2014-169466
[Patent Document 2] Japanese Patent Laid-Open Publication No. 2014-170784

SUMMARY OF THE INVENTION

An aspect of the present invention aims at enhancing properties of a ferromagnetic film formed on a substrate.

Furthermore, an aspect of the present invention aims at providing a film structure body capable of increasing force which is received by the film structure body and which is other than force caused by an inverse piezoelectric effect. Moreover, an aspect of the present invention aims at providing an actuator or a motor using the film structure body.

Hereinafter, various aspects of the present invention will be described.

[1] A film structure body, including a single crystal substrate; and a first ferromagnetic film oriented and formed on the single crystal substrate.

[2] The film structure body according to [1], including a first film disposed between the single crystal substrate and the first ferromagnetic film, and oriented and formed on the single crystal substrate.

[3] The film structure body according to [1] or [2], including a piezoelectric film formed on the first ferromagnetic film.

[4] A film structure body, including:
a first ferromagnetic film; and
a piezoelectric film formed on the first ferromagnetic film.

[5] The film structure body according to [3] or [4], including a second ferromagnetic film or a second electroconductive film formed on the piezoelectric film.

[6] The film structure body according to [1], including a piezoelectric film disposed between the single crystal substrate and the first ferromagnetic film.

[7] A film structure body, including:
a piezoelectric film; and
a first ferromagnetic film formed on the piezoelectric film.

[8] The film structure body according to [6], including:
a first film oriented and formed on the single crystal substrate; and
a first electroconductive film formed on the first film, wherein the first film and the first electroconductive film are disposed between the single crystal substrate and the piezoelectric film.

[9] The film structure body according to [2] or [8], wherein:
the single crystal substrate is a silicon substrate; and
the first film is a metal oxide film oxidized more easily than silicon.

[10] The film structure body according to any one of [1] to [9], wherein the first ferromagnetic film is a metal film.

[11] The film structure body according to [9], wherein:
the silicon substrate has a main surface constituted of a (100) plane; and
the first film has a cubic crystal structure and contains (100)-oriented zirconium oxide.

[12] The film structure body according to any one of [3] to [5], including a first electroconductive film formed between the first ferromagnetic film and the piezoelectric film.

[13] The film structure body according to any one of [1] to [12], wherein the first ferromagnetic film has a cubic crystal structure and contains (100)-oriented nickel.

[14] The film structure body according to any one of [1] to [12], wherein the first ferromagnetic film has a tetragonal crystal structure and contains (001)-oriented $R_2Fe_{14}B$ (R is at least one element selected from rare-earth elements).

[15] The film structure body according to any one of [1] to [12], wherein the first ferromagnetic film has a hexagonal crystal structure and contains (11-20)-oriented $RCo_5$ (R is at least one element selected from rare-earth elements).

[16] The film structure body according to any one of [1] to [12], wherein the first ferromagnetic film contains an alloy of iron, nickel, cobalt and aluminum.

[17] The film structure body according to any one of [1] to [12], wherein the first ferromagnetic film contains an alloy of iron and platinum.

[18] The film structure body according to any one of [3] to [8], and [12], wherein the piezoelectric film has a tetragonal crystal structure and contains (001)-oriented lead zirconate titanate.

[19] The film structure body according to any one of [3] to [8], and [12], wherein the piezoelectric film has a rhombohedral crystal structure and contains (100)-oriented lead zirconate titanate.

[20] The film structure body according to [8] or [12], wherein the first electroconductive film has a cubic crystal structure and contains (100)-oriented platinum.

[21] The film structure body according to [8] or [12], wherein the first electroconductive film has a cubic crystal structure and contains (100)-oriented strontium ruthenate.

[22] An actuator, including:
the film structure body according to any one of [3] to [8], [12], and [18] to [21];
a ferromagnetic substance disposed on an opposite side of the piezoelectric film with the single crystal substrate sandwiched therebetween, separately from the film structure body; and
a holding part that is connected to a first end part of the film structure body and a second end part of the ferromagnetic substance and holds a gap between the first end part and the second end part.

[23] A motor, including a rotatory part or a stationary part including the film structure body according to any one of [3] to [8], [12], and [18] to [21].

[24] A motor having a rotatory part and a stationary part, wherein:
the rotatory part has a ring-shaped rotor, a first N-pole permanent magnet, a first S-pole permanent magnet, a second N-pole permanent magnet and a second S-pole permanent magnet which are disposed on an inside circumference of the rotor; and
the stationary part has a ring-shaped stator and a plurality of piezoelectric elements including the film structure body according to [5] or [8], disposed along on the stator.

[25] A method for manufacturing a film structure body, including the steps of:
epitaxially growing a first film on a single crystal substrate; and
epitaxially growing a first ferromagnetic film on the first film.

[26] The method for manufacturing a film structure body according to [25], including the step of epitaxially growing a piezoelectric film on the first ferromagnetic film.

[27] The method for manufacturing a film structure body according to [26], including the step of epitaxially growing a second ferromagnetic film on the piezoelectric film.

[28] A method for manufacturing a film structure body, including the steps of:
epitaxially growing a first film on a single crystal substrate;
epitaxially growing a first electroconductive film on the first film;
epitaxially growing a piezoelectric film on the first electroconductive film; and
epitaxially growing a ferromagnetic film on the piezoelectric film.

[29] The method for manufacturing a film structure body according to any one of [25] to [28], wherein:
the single crystal substrate is a silicon substrate; and
the first film is a metal oxide film oxidized more easily than silicon.

[30] The method for manufacturing a film structure body according to [29], wherein:
the silicon substrate has a main surface constituted of a (100) plane;
the first film is epitaxially grown on the main surface; and
the first film has a cubic crystal structure and contains (100)-oriented zirconium oxide.

Note that, in the various aspects of the present invention, when forming a specific C (hereinafter, referred to as "C") (or when C is formed) on (or beneath) a specific B (hereinafter, referred to as "B"), the formation is not limited to a case of forming C (or when C is formed) directly on (or beneath) B, but a case of forming C (or when C is formed) above (or beneath) B via another substance in a range not inhibiting a working effect of an aspect of the present invention is also included.

Furthermore, in the various aspects of the present invention, aspects in which the vertical direction is reversed are also included. In other words, aspects obtained by reversing the vertical direction of the film structure body are not intended to be excluded.

It is possible to enhance properties of a ferromagnetic film formed on a substrate, by applying an aspect of the present invention.

Furthermore, it is possible to provide a film structure body in which force received by the film structure body and force other than force caused by an inverse piezoelectric effect can be increased, by applying an aspect of the present invention. Moreover, it is possible to provide an actuator or a motor using the film structure body, by applying an aspect of the present invention.

BRIEF DESCRIPTION OF THE DRAWINGS

FIG. 16 is a schematic view showing a method for operating the piezoelectric stepping motor in the piezoelectric magnet motor shown in FIG. 14C.

DESCRIPTION OF THE PREFERRED EMBODIMENTS

Hereinafter, embodiments of the present invention will be described in detail through the use of the drawings. However, a person skilled in the art would easily understand that the present invention is not limited to the following explanation, but forms and details thereof can be variously modified without deviating from the purport and the scope of the present invention. Accordingly, the present invention is not to be construed as being limited to description of the embodiments shown below.

First Embodiment

<Film Structure Body>

Figure 1:
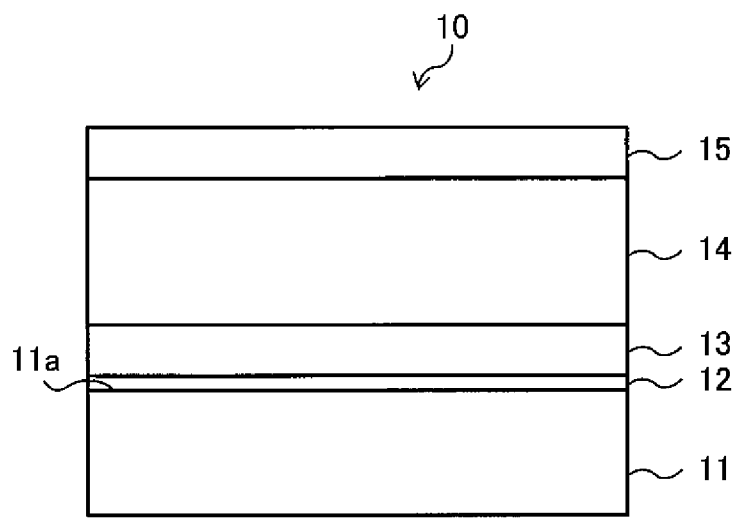
FIG. 1 is a cross-sectional view of a film structure body of a first embodiment.

First, there will be described a film structure body of a first embodiment, which is one embodiment of the present invention. FIG. 1 is a cross-sectional view of the film structure body of the first embodiment.

As shown in FIG. 1, a film structure body 10 of the first embodiment has a substrate 11, an alignment film (also referred to as a first film) 12 oriented to a prescribed plane, and a ferromagnetic film 13 (also referred to as a first ferromagnetic film). The use of a single crystal substrate as the substrate 11 is favorable, and the single crystal substrate includes a silicon (Si) substrate. The alignment film 12 is epitaxially grown on the substrate 11, and is oriented and formed on the substrate 11. A metal oxide film oxidized more easily than the substrate 11 is favorable as the alignment film 12, and when the substrate 11 is a silicon substrate, a film oxidized more easily than silicon (for example, a film containing zirconium and oxygen, a $ZrO_2$ film, a $CeO_2$ film, $HfO_2$ film or the like) is favorable. The ferromagnetic film 13 may be a permanent magnet film. The ferromagnetic film 13 is epitaxial grown on the alignment film 12. Furthermore, the ferromagnetic film 13 is oriented and formed on the alignment film 12. The ferromagnetic film 13 is favorably a metal film.

Note that, in the present embodiment, a film structure having the substrate 11, the alignment film 12 and the ferromagnetic film 13 is described as the film structure body 10, but a film structure having the substrate 11, and the ferromagnetic film 13 oriented and formed on the substrate 11 may be set as the film structure body.

According to the present embodiment, since the ferromagnetic film 13 is oriented and formed, properties of the ferromagnetic film 13 can be enhanced as compared with a non-oriented ferromagnetic film. Furthermore, there is an advantage that, when the ferromagnetic film 13 is oriented, the film is easily polarized.

Here, when two directions that cross orthogonally each other in an upper surface 11a as the main surface of the substrate 11 are defined as an X-axis direction and a Y-axis direction, and the direction perpendicular to the upper surface 11a is defined as a Z-axis direction, an epitaxially grown film means that the film is preferably oriented in any direction of the X-axis direction, the Y-axis direction and the Z-axis direction.

The substrate 11, suitably, is constituted of a silicon single crystal and has the upper surface 11a as a main surface constituted of a (100) plane. The alignment film 12 is favorably epitaxially grown on the upper surface 11a constituted of the (100) plane of the substrate 11. The alignment film 12 favorably contains zirconium oxide ($ZrO_2$) that has a cubic crystal structure and is (100)-oriented. For example, the alignment film 12 constituted of a (100)-oriented $ZrO_2$ film is formed on the upper surface 11a constituted of a (100) plane, of the substrate 11 constituted of a silicon single crystal.

Here, the fact that "the alignment film 12 is (100)-oriented" means that favorably the (100) plane of the alignment film 12 having a cubic crystal structure is positioned along the upper surface 11a, as a main surface constituted of a (100) plane, of the substrate 11 constituted of a silicon single crystal, and that suitably it is parallel to the upper surface 11a constituted of a (100) plane, of the substrate 11 constituted of a silicon single crystal. Furthermore, the fact that "the (100) plane of the alignment film 12 is parallel to the upper surface 11a constituted of a (100) plane, of the substrate 11" includes not only the case where the (100) plane of the alignment film 12 is completely parallel to the upper surface 11a of the substrate 11, but also cases where an angle formed between a plane completely parallel to the upper surface 11a of the substrate 11 and the (100) plane of the alignment film 12 is 20 degrees or less.

Alternatively, as the alignment film 12, the alignment film 12 constituted of a laminated film may be formed on the substrate 11, instead of the alignment film 12 constituted of a single layer film.

When a permanent magnet film is used as the ferromagnetic film 13, a permanent magnet film containing a rare-earth element, that is, a permanent magnet film constituted of a rare-earth magnet can be used. Alternatively, a permanent magnet film other than a rare-earth magnet can be used as a permanent magnet film.

There can be used, as a permanent magnet film 13 constituted of a rare-earth magnet, favorably, when R denotes at least one element selected from rare-earth elements, a permanent magnet film containing at least one rare-earth magnet selected from the group consisting of R—Fe—B-based rare-earth magnets such as $R_2Fe_{14}B$, R—Co-based rare-earth magnets such as $RCo_5$ and $R_2$ (Co, Fe, Cu, Zr)$_{17}$, and R—Fe—N-based rare-earth magnets such as $R_2Fe_{17}N_3$ and $RFe_7N_x$. Accordingly, residual magnetization perpendicular to the surface of the permanent magnet film 13 can be made larger than in cases where a permanent magnet film other than the rare-earth magnet is used.

When the permanent magnet film 13 contains $R_2Fe_{14}B$, suitably, the permanent magnet film 13 has a tetragonal crystal structure and is (001)-oriented. In $R_2Fe_{14}B$ having a tetragonal crystal structure, residual magnetization along the [001] direction can be easily obtained, and thus the (001)-oriented $R_2Fe_{14}B$ easily becomes a perpendicular magnetization film having magnetization perpendicular to the surface of the permanent magnet film 13. Accordingly, the residual magnetization of the permanent magnet film 13 can be further increased. Furthermore, when $Nd_2Fe_{14}B$ is used as $R_2Fe_{14}B$, residual magnetization perpendicular to the surface of the permanent magnet film 13 can be further made larger.

Note that, the fact that "$R_2Fe_{14}B$ having a tetragonal crystal structure is (001)-oriented" means that, in terms of the Miller index of the tetragonal system, the (001) plane of $R_2Fe_{14}B$ is oriented so as to be parallel to the upper surface 11a as the main surface of the substrate 11.

When the permanent magnet film 13 contains $RCo_5$, the permanent magnet film 13 has suitably a hexagonal crystal structure and is (11-20)-oriented. In $RCo_5$ having a hexagonal crystal structure, since residual magnetization along the [0001] direction can be easily obtained, the (11-20)-oriented $RCo_5$ easily becomes a perpendicular magnetization film having magnetization parallel to the surface of the permanent magnet film 13, and, at this time, magnetization perpendicular to the surface of the permanent magnet film 13 also becomes increased all together to some extent. Accordingly, residual magnetization perpendicular to the surface of the permanent magnet film 13 can be further increased.

Furthermore, when $SmCo_5$ is used as $RCo_5$, residual magnetization perpendicular to the surface of the permanent magnet film 13 can be further increased, and heat resistance and corrosion resistance can be enhanced. Moreover, when $PrCo_5$ is used as $RCo_5$, residual magnetization perpendicular to the surface of the permanent magnet film 13 can be further increased, and mechanical strength can be enhanced.

Note that the fact that "$RCo_5$ having a hexagonal crystal structure is (11-20)-oriented" means that, in terms of the Miller index of the hexagonal system, the (11-20) plane of $RCo_5$ is oriented so as to become parallel to the upper surface 11a as the main surface of the substrate 11.

When the permanent magnet film 13 contains $R_2$(Co, Fe, Cu, Zr)$_{17}$, the permanent magnet film 13 suitably has a hexagonal crystal structure and is (11-20)-oriented. In $R_2$(Co, Fe, Cu, Zr)$_{17}$ having a hexagonal crystal structure, since residual magnetization along the [0001] direction can be easily obtained, the (11-20)-oriented $R_2$(Co,Fe,Cu,Zr)$_{17}$ easily becomes a perpendicular magnetization film having magnetization perpendicular to the surface of the permanent magnet film 13, and, at this time, magnetization perpendicular to the surface of the permanent magnet film 13 also increases all together to some extent. Accordingly, the residual magnetization of the permanent magnet film 13 can be further increased.

Furthermore, when $Sm_2Co_{17}$ is used as $R_2$ (CO, Fe, Cu, Zr)$_{17}$, residual magnetization perpendicular to the surface of the permanent magnet film 13 can be further increased, and heat resistance and corrosion resistance can be enhanced.

Note that the fact that "$R_2$(Co, Fe, Cu, Zr)$_{17}$ having a hexagonal crystal structure is (11-20)-oriented" means that, in terms of the Miller index of the hexagonal system, the (11-20)-plane of $R_2$(Co, Fe, Cu, Zr)$_{17}$ is oriented so as to become parallel to the main surface of the substrate 11.

On the other hand, there can be used, as a permanent magnet film other than the rare-earth magnet, a permanent magnet film constituted of at least one selected from the group consisting of a nickel (Ni) magnet, Al—Ni—Co based magnets such as an Al—Ni—Co alloy, Fe—Pt-based magnets such as $Fe_3Pt$, FePt and $FePt_3$, Fe—Cr—Co-based magnets, a Sr ferrite magnet, and Co—Fe—B-based magnets.

When the permanent magnet film 13 contains nickel (Ni), the permanent magnet film 13 suitably has a cubic crystal structure and is (100)-oriented. In Ni having a cubic crystal structure, residual magnetization along the [100] direction is obtained, and thus the residual magnetization of the permanent magnet film 13 can be further increased.

Note that, the fact that "Ni having a cubic crystal structure is (100)-oriented" means that, in terms of the Miller index of the cubic system, the (100) plane ({001} plane) of Ni is oriented so as to be parallel to the upper surface 11a as the main surface of the substrate 11.

When the permanent magnet film 13 contains an Al—Ni—Co alloy, namely, contains an alloy of iron, nickel, cobalt and aluminum, the permanent magnet film 13 suitably has a cubic crystal structure and is (100)-oriented. In an Al—Ni—Co alloy having a cubic crystal structure, residual magnetization along the [100] direction can be obtained, and thus the residual magnetization of the permanent magnet film 13 can be further increased.

When the permanent magnet film 13 contains $Fe_3Pt$, FePt or $FePt_3$, namely, contains an alloy of iron and platinum, the permanent magnet film 13 suitably has a cubic crystal structure and is (100)-oriented. In $Fe_3Pt$, FePt or $FePt_3$ having a cubic crystal structure, residual magnetization along the [100] direction is obtained, and thus the residual magnetization of the permanent magnet film 13 can be further increased.

An epitaxially grown piezoelectric film 14 is formed on the ferromagnetic film 13. Note that, in the present embodiment, a film structure having the substrate 11, the alignment film 12 and the ferromagnetic film 13 is described as the film structure body 10, but a film structure having the substrate 11, the alignment film 12, the ferromagnetic film 13 and the piezoelectric film 14 may be set as the film structure body.

The piezoelectric film 14 containing lead zirconate titanate (PZT), namely, $PbZr_xTi_{1-x}O_3$ (0<x<1) can be used as the piezoelectric film 14. Accordingly, the piezoelectric constant of the piezoelectric film 14 can be made larger than in a case where the piezoelectric film 14 does not contain lead zirconate titanate.

When the piezoelectric film 14 contains PZT, suitably, the piezoelectric film 14 has a tetragonal crystal structure and is (001)-oriented. In PZT having a tetragonal crystal structure, when an electric field along the [001] direction is applied, large piezoelectric constants d33 and d31 are obtained. Accordingly, the piezoelectric constant of the piezoelectric film 14 can be further increased.

When the piezoelectric film 14 contains PZT, suitably, piezoelectric film 14 has a rhombohedral crystal structure and is (100)-oriented. In PZT having a rhombohedral crystal structure, when an electric field along the [100] direction is applied, large piezoelectric constants d33 and d31 are obtained. Consequently, the residual magnetization of the piezoelectric film 14 can be further increased.

Furthermore, the film structure body 10 of the first embodiment may have an electroconductive film 15 (also referred to as a second electroconductive film) formed on the piezoelectric film 14. In such a case, it is possible to strain the piezoelectric film 14 by applying a voltage between the ferromagnetic film 13 and the electroconductive film 15 using the ferromagnetic film 13 as a lower electrode and the electroconductive film 15 as an upper electrode. Alternatively, it is possible to detect strain magnitude of the piezoelectric film 14 by measuring a voltage between the ferromagnetic film 13 and the electroconductive film 15.

Note that, in the present embodiment, the ferromagnetic film 13 is set as a lower electrode and the electroconductive film 15 is set as an upper electrode, but a lower electrode may be formed of an electroconductive film and an upper electrode may be formed of a ferromagnetic film. In other words, in the present embodiment, the alignment film 12, the ferromagnetic film (lower electrode) 13, the piezoelectric film 14 and the electroconductive film (upper electrode) 15 are formed in this order on the substrate 11, but the alignment film 12, an electroconductive film (lower electrode), a piezoelectric film and a ferromagnetic film (upper electrode) may be formed in this order on the substrate 11. Each of the alignment film 12, the electroconductive film (lower electrode), the piezoelectric film and the ferromagnetic film (upper electrode) is favorably formed by epitaxial growth.

Furthermore, in the present embodiment, the ferromagnetic film 13 is set as a lower electrode and the electroconductive film 15 is set as an upper electrode, but both a lower electrode and an upper electrode may be formed of a ferromagnetic film. In other words, in the present embodiment, the alignment film 12, the ferromagnetic film (lower electrode) 13, the piezoelectric film 14 and the electroconductive film (upper electrode) 15 are formed in this order on the substrate 11, but the alignment film 12, a ferromagnetic film (lower electrode), a piezoelectric film and a ferromagnetic film (also referred to as an upper electrode or a second ferromagnetic film) may be formed in this order on the substrate 11. Each of the alignment film 12, the ferromagnetic film (lower electrode), the piezoelectric film and the ferromagnetic film (upper electrode) is favorably formed by epitaxial growth.

According to the present embodiment, the piezoelectric property of a ferroelectric body (piezoelectric film) is reinforced with attractive/repulsive force of the ferromagnetic film by formation of one of or both of an upper electrode and a lower electrode through the use of a ferromagnetic film, and in addition, since a magnetic electrode works as a ferrite core, high frequency noise generated when a current flows is reduced by the rectification action thereof, with the result that the piezoelectric property can be effectively taken out effectively.

Figure 2:
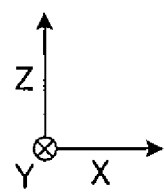
FIG. 2 is a view explaining an epitaxially grown state of films of respective layers contained in a film structure body.
Figure 2:
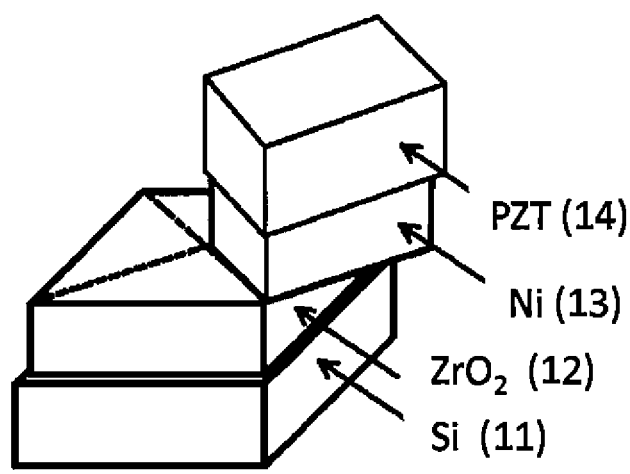

FIG. 2 is a drawing describing a state where films of respective layers contained in a film structure body is epitaxially grown. In FIG. 2, a case where the permanent magnet film 13 as a ferromagnetic film contains Ni will be described as an example. However, cases other than the case where the permanent magnet film 13 contains Ni can also be described in the same way.

When the permanent magnet film 13 contains Ni, the lattice constant of Si contained in the substrate 11, the lattice constant of $ZrO_2$ contained in the alignment film 12, the lattice constant of Ni contained in the permanent magnet film 13, and the lattice constant of PZT contained in the piezoelectric film 14 are as shown in Table in FIG. 2.

Matching property between the lattice constant of $ZrO_2$ and the lattice constant of Si is good. Consequently, the alignment film 12 containing $ZrO_2$ can be epitaxially grown on the main surface constituted of a (100) plane of the substrate 11 containing a silicon single crystal, the alignment film 12 containing $ZrO_2$ can be (100)-oriented on the (100) plane of the substrate 11 containing a silicon single crystal, and the crystallinity of the alignment film 12 can be enhanced.

Furthermore, matching property between the lattice constant of Ni and the lattice constant of $ZrO_2$ is good. The reason is that, when Ni rotates by 45 degrees in a flat surface, the length of the diagonal line matches the a axis of $ZrO_2$, although the lattice constant of Ni is smaller than the lattice constant of $ZrO_2$. Accordingly, the permanent magnet film 13 containing Ni can be epitaxially grown on the alignment film 12 containing $ZrO_2$, the permanent magnet film 13 containing Ni can be (100)-oriented on the (100) plane of the alignment film 12 containing $ZrO_2$, and the crystallinity of the permanent magnet film 13 can be enhanced.

Moreover, matching property between the lattice constant of PZT and the lattice constant of Ni is good. Consequently, the piezoelectric film 14 containing PZT can be epitaxially grown on the permanent magnet film 13 containing Ni, the piezoelectric film 14 containing PZT can be (100)-oriented on the (100) plane of the permanent magnet film 13 containing Ni, and the crystallinity of the piezoelectric film 14 can be enhanced.

In this way, in the first embodiment, the permanent magnet film 13 and the piezoelectric film 14 are epitaxially grown. Accordingly, the residual magnetization of a permanent magnet film 15a can be increased as compared with a case where the permanent magnet film 15a is not epitaxially grown, and the piezoelectric constant of the piezoelectric film 14 can be increased as compared with a case where the piezoelectric film 14 is not epitaxially grown. In addition, the piezoelectric constant of the piezoelectric film 14 can be increased, and there can be increased the force that is received by the film structure body 10 and that is force other than force caused by an inverse piezoelectric effect.

Figure 3:
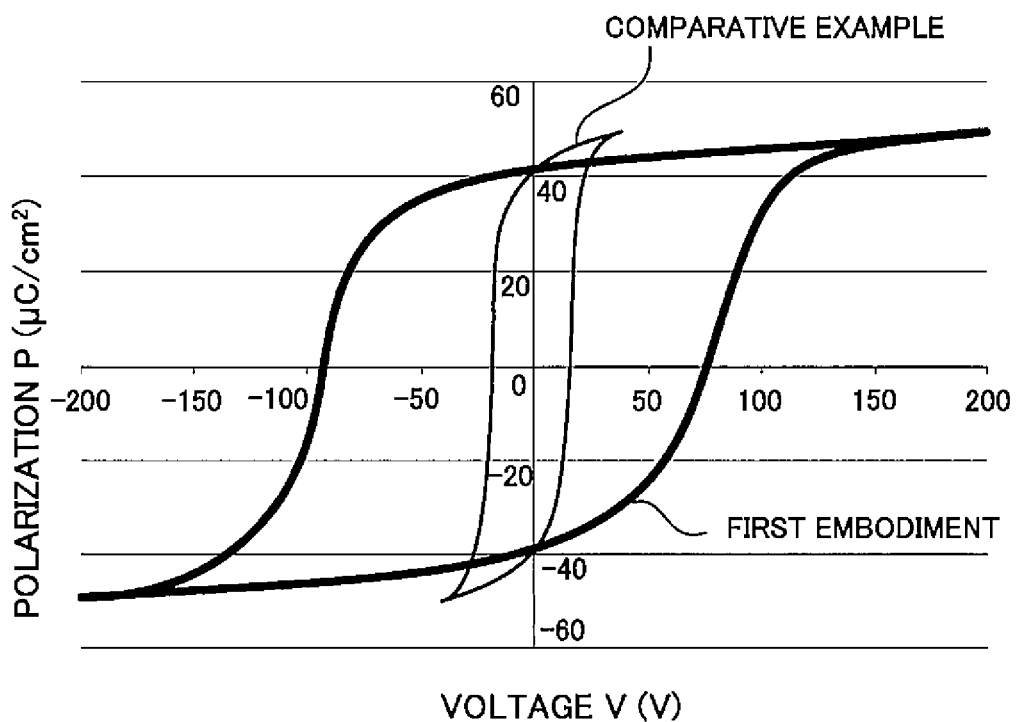
FIG. 3 is a graph showing voltage dependency of polarization of a piezoelectric film contained in the film structure body of the first embodiment.

FIG. 3 is a graph showing voltage dependency of polarization of a piezoelectric film contained in the film structure body of the first embodiment. In other words, FIG. 3 is a graph showing a P-V hysteresis curve. Furthermore, in FIG. 3, the voltage dependency of polarization of the piezoelectric film 14 contained in the film structure body of the first embodiment is shown together with the voltage dependency of polarization of the piezoelectric film 14 contained in a film structure body in Comparative Example. The piezoelectric film 14 contained in the film structure body in Comparative Example is not epitaxially grown by omitting the alignment film 12 or changing the film formation condition, that is, the piezoelectric film 14 contained in the film structure body in Comparative Example is not oriented in any of directions perpendicular to the upper surface 11a as the main surface of the substrate 11 and two directions that are parallel to the upper surface 11a as the main surface of the substrate 11 and are orthogonal to each other.

As shown in FIG. 3, in the piezoelectric film 14 contained in the film structure body of the first embodiment, a voltage necessary for polarization inversion, that is, a withstand voltage is large, and, for example, the absolute value of the withstand voltage when a voltage is inversed from a positive voltage to a negative voltage is approximately 100 V. On the other hand, the absolute value of the withstand voltage of the piezoelectric film 14 contained in the film structure body in Comparative Example is approximately 20 V. A large withstand voltage means that the polarization of the piezoelectric film 14 is stabilized by the orientation of the polarization axis of the piezoelectric film 14 in the direction perpendicular to the upper surface 11a as the main surface of the substrate 11. Furthermore, it means that, even when periodically changing voltages are applied to the piezoelectric film 14 to thereby generate strain periodically, the magnitude of generated strain does not deteriorate but is stable. Alternatively, it means that, even when periodically changing strains are applied to the piezoelectric film 14 to thereby generate voltages periodically, the generated voltage does not deteriorate but is stable.

In the same way, although diagrammatic representation is omitted, in the permanent magnet film 13 contained in the film structure body 10 of the first embodiment, magnetic field dependency of the magnetization, that is, a voltage necessary for magnetization inversion in a magnetization hysteresis curve, namely, coercivity is large. Large coercivity means that the residual magnetization of the permanent magnet film 13 is stabilized by the orientation of the easily magnetized direction of the permanent magnet film 13 in the direction perpendicular to or parallel to the upper surface 11a as the main surface of the substrate 11. Furthermore, the large coercivity means that, even when periodically changing magnetic fields are applied to the permanent magnet film 13, the residual magnetization of the permanent magnet film 13 does not deteriorate but is stable.

Note that the direction and magnitude of the magnetization of the permanent magnet film 13 can be controlled such that, for example, the magnetization of the permanent magnet film 13 is reversed by a magnetic field generated with the change in the polarization magnitude of the piezoelectric film 14, by changing the electric potential of the electroconductive film 15 relative to the permanent magnet film 13 in a state where the permanent magnet film 13 is electrically connected with an external circuit and the electroconductive film 15 is electrically connected with an external circuit.

Alternatively, the direction and magnitude of the magnetization of the permanent magnet film 13 can be controlled such that, for example, the magnetization of the permanent magnet film 13 is reversed, by changing the electric potential of the electroconductive film 15 in a state where the permanent magnet film 13 is electrically floated from an external circuit and the electroconductive film 15 is electrically connected with an external circuit.

Alternatively, the direction and magnitude of the magnetization of the permanent magnet film 13 can be controlled such that, for example, the magnetization of the permanent magnet film 13 is reversed, by causing a current flow from one end of the permanent magnet film 13 to the other end.

<Actuator>

Next, with reference to FIGS. 4 to 9, there will be described an example in which the film structure body of the first embodiment is applied to an actuator.

Figure 4:
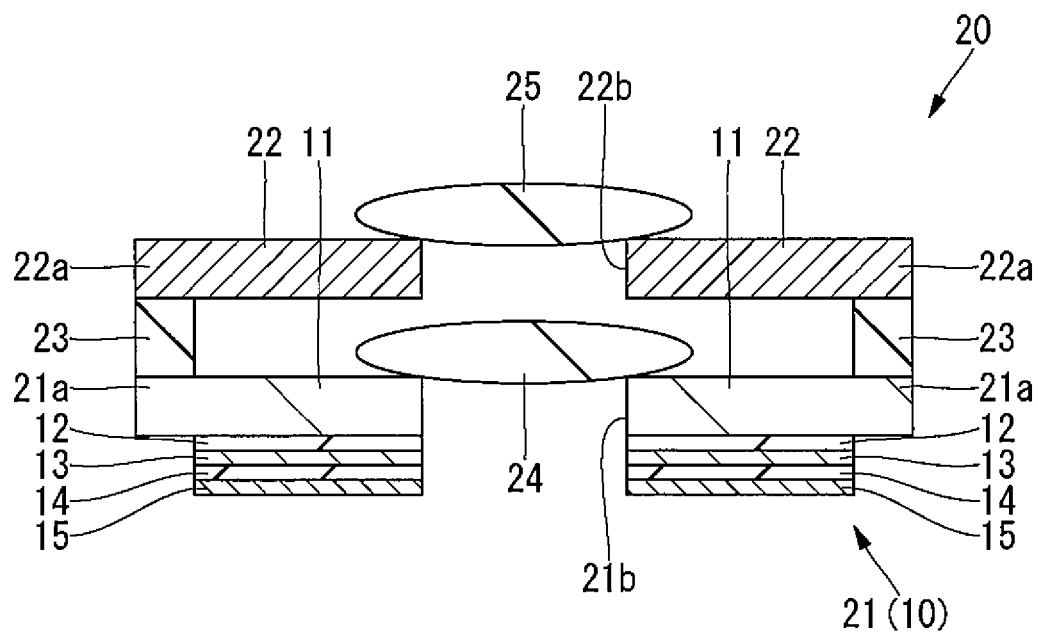
FIG. 4 is a cross-sectional view showing an example of an actuator provided with the film structure body of the first embodiment.

FIG. 4 is a cross-sectional view showing an example of an actuator provided with the film structure body of the first embodiment. The actuator shown in FIG. 4 is used as an actuator for adjusting a focus position by moving a lens in the optical axis direction, in an autofocus system provided in a camera module contained in, for example, a camera or a smartphone.

An actuator 20 shown in FIG. 4 is provided with a film structure body 21, a ferromagnetic substance 22, a holding part 23, a convex lens 24 and a convex lens 25. The film structure body 10 of the first embodiment can be used as the film structure body 21. The ferromagnetic substance 22 is disposed on the opposite side of the alignment film 12 with the substrate 11 contained in the film structure body 10 sandwiched therebetween, separately from the film structure body 10. The holding part 23 is connected to an end part 21a of the film structure body 21 and an end part 22a of the ferromagnetic substance 22, and holds a gap between the end part 21a and the end part 22a. Note that the ferromagnetic substance 22 may be disposed on the opposite side of the substrate 11 with the electroconductive film 15 therebetween.

In the example shown in FIG. 4, the film structure body 21 and the ferromagnetic substance 22 have, for example, a circular shape when seen from the direction perpendicular to the main surface of the substrate 11, that is, in plan view, and the holding part 23 is connected to an outer circumference part of the film structure body 21 and an outer circumference part of the ferromagnetic substance 22. Accordingly, the holding part 23 has a ring-like shape in plan view. In the central part of the film structure body 21, a through-hole 21b passing through the film structure body 21 is formed. The through-hole 21b has, for example, a circular shape in plan view. On the other hand, in the central part of the ferromagnetic substance 22, a through-hole 22b passing through the ferromagnetic substance is formed. The through-hole 22b has, for example, a circular shape in plan view. The convex lens 24 is attached to the film structure body 10, for example, so as to close the through-hole 21b, and the convex lens 25 is attached to the ferromagnetic substance 22, for example, so as to close the through-hole 22b. The center of the convex lens 25 overlaps the center of the convex lens 24.

Figure 5:
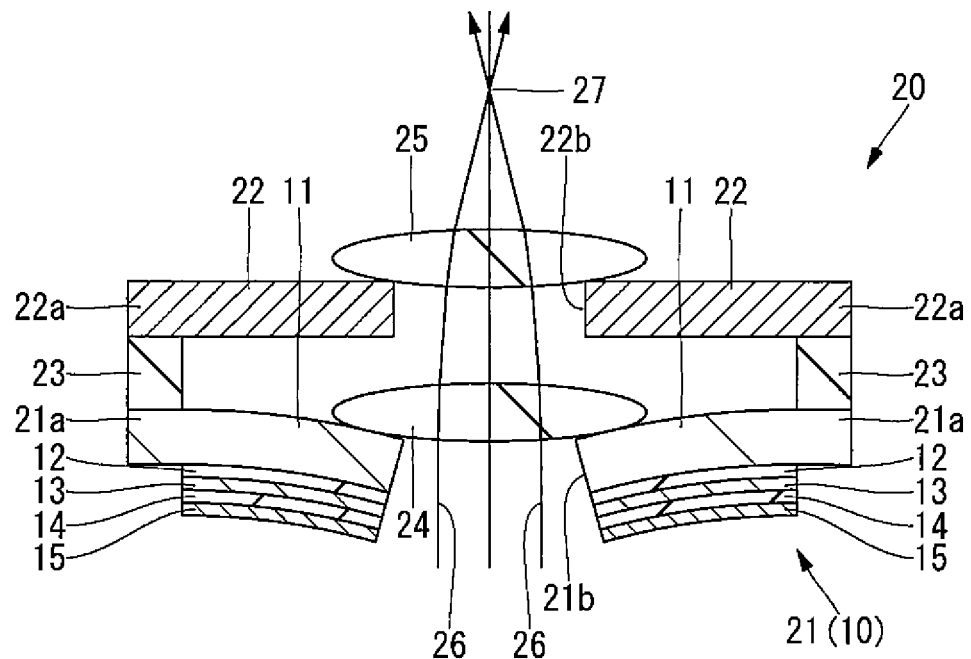
FIG. 5 is a cross-sectional view showing an operation of an example of an actuator provided with the film structure body of the first embodiment.
Figure 6:
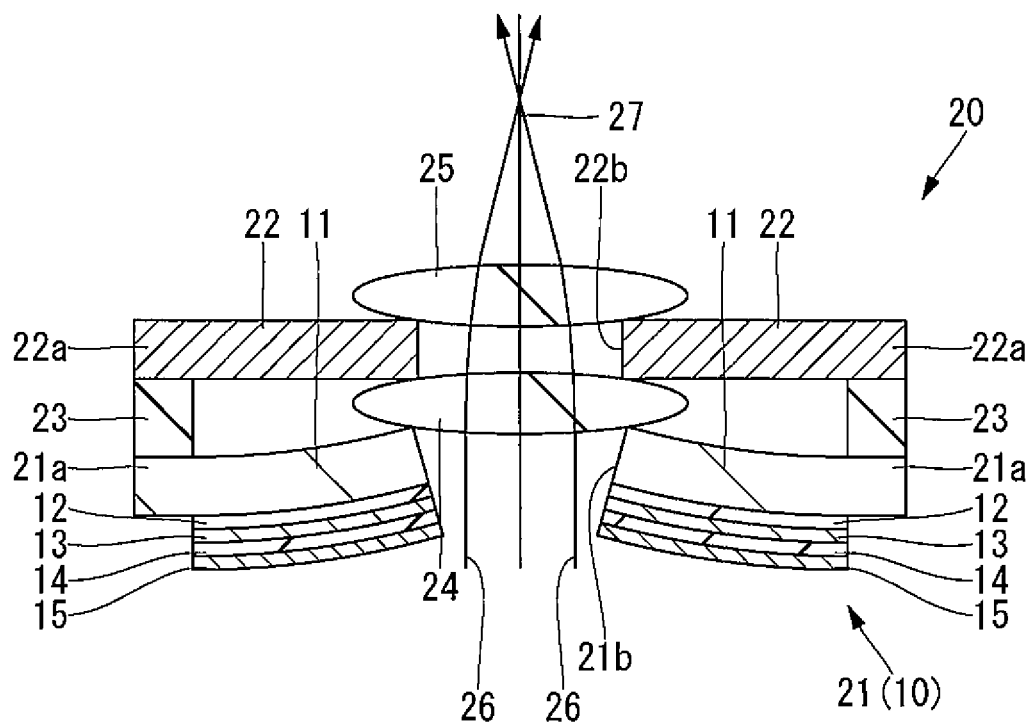
FIG. 6 is a cross-sectional view showing an operation of an example of an actuator provided with the film structure body of the first embodiment.

FIGS. 5 and 6 are cross-sectional views showing an operation of an example of an actuator provided with the film structure body of the first embodiment.

There is considered a case where a voltage is applied between the permanent magnet film 13 and the electroconductive film 15 so that the piezoelectric film 14 contracts in an in-plane direction. At this time, as shown in FIG. 5, since a part adjacent to the through-hole 21b of the film structure body 21 is displaced toward the side opposite to the ferromagnetic substance 22 side in the direction perpendicular to the main surface of the substrate 11, the convex lens 24 is also displaced toward the side opposite to the ferromagnetic substance 22 side relative to the convex lens 24 in the direction perpendicular to the main surface of the substrate 11, and the distance between the convex lens 24 and the convex lens 25 in the direction perpendicular to the main surface of the substrate 11 becomes larger.

After that, there is considered a case where the voltage between the permanent magnet film 13 and the electroconductive film 15 is returned to 0. At this time, as shown in FIG. 6, since a part adjacent to the through-hole 21b of the film structure body 21 returns to the ferromagnetic substance 22 side in the direction perpendicular to the main surface of the substrate 11, the convex lens 24 also returns to the ferromagnetic substance 22 side relative to the convex lens 24 in the direction perpendicular to the main surface of the substrate 11, and the distance between the convex lens 24 and the convex lens 25 in the direction perpendicular to the main surface of the substrate 11 becomes smaller.

In this way, there can be freely adjusted a focus position 27 of light 26 that enters the convex lens 24 from the side opposite to the convex lens 25 and has passed through the convex lens 24 and the convex lens 25.

In contrast, in the example shown in FIG. 4, since the film structure body 10 as the film structure body 21 has the permanent magnet film 13, magnetic attractive force works between the permanent magnet film 13 and the ferromagnetic substance 22. Accordingly, return speed of a part adjacent to the through-hole 21b of the film structure body 21 toward the ferromagnetic substance 22 side becomes faster.

Figure 7:
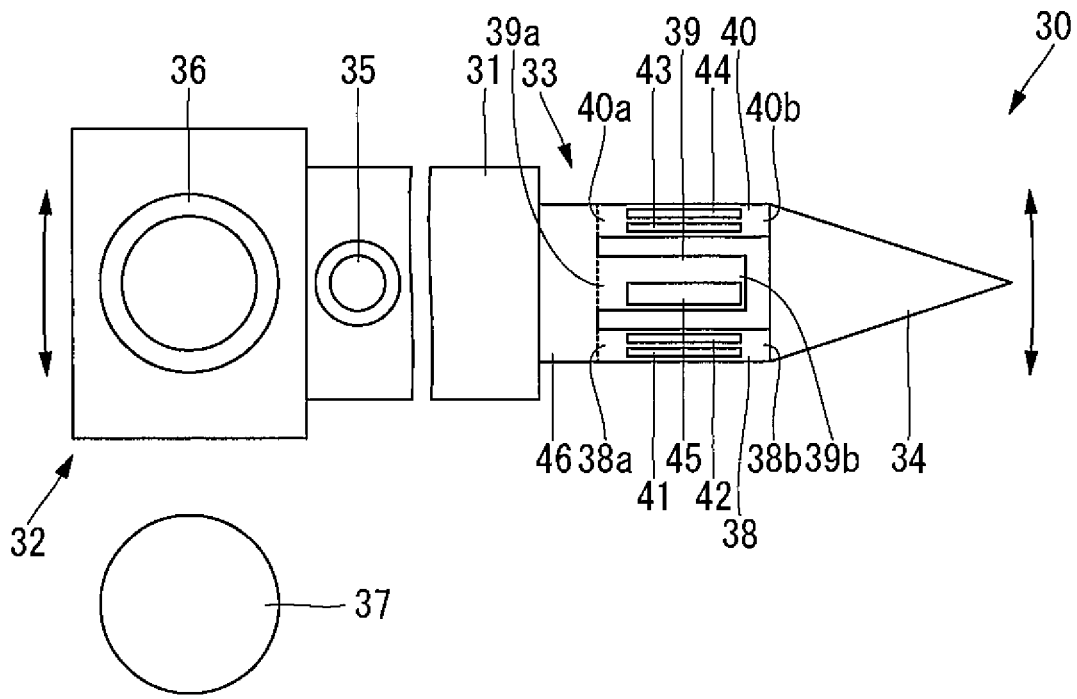
FIG. 7 is a cross-sectional view showing another example of an actuator provided with the film structure body of the first embodiment.
Figure 8:
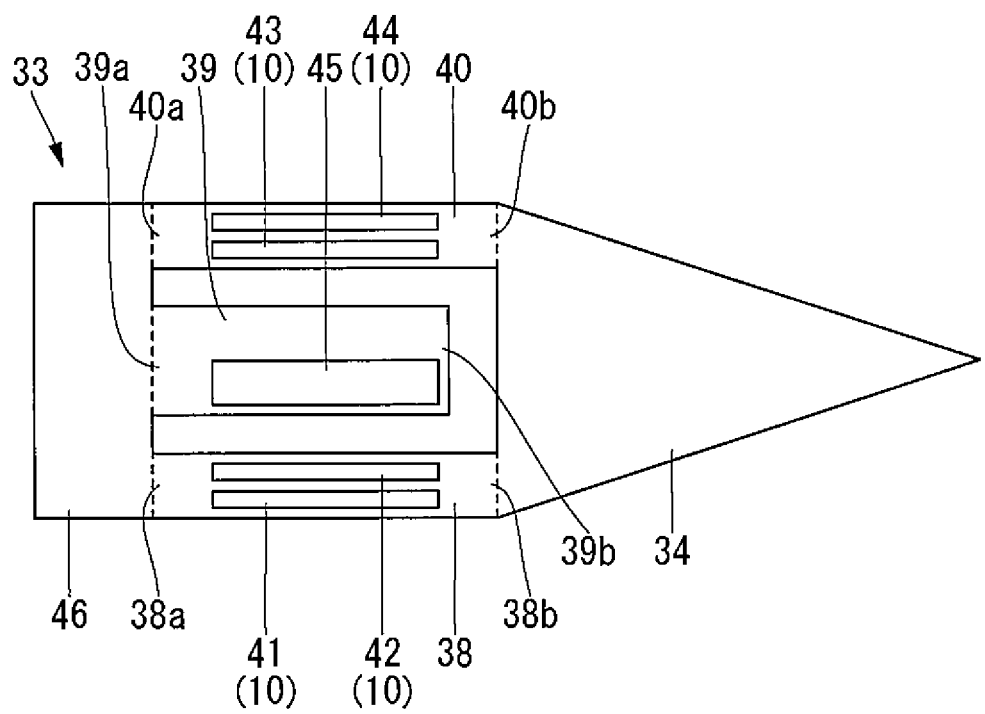
FIG. 8 is a cross-sectional view showing another example of an actuator provided with the film structure body of the first embodiment.

FIGS. 7 and 8 are cross-sectional views showing other examples of actuators provided with the film structure body of the first embodiment. The actuators shown in FIGS. 7 and 8 are included in, for example, a hard disk driving system, and are used as an actuator for moving, by a minute distance, a magnetic head performing writing, deletion and reading relative to the disk.

As shown in FIG. 7, a magnetic head 30 has a rotation body 31, a first actuator 32, a second actuator 33 and a head 34. A movable range of the magnetic head 30 by the second actuator 33 is smaller than a movable range of the magnetic head 30 by the first actuator 32. Accordingly, the first actuator 32 and the second actuator 33 are dual stage actuators (DSA).

The rotation body 31 is mounted on a housing (not shown) included in the hard disk driving system, so as to be rotatable centering around a shaft 35. The first actuator 32 includes, for example, a coil 36 and rotates the rotation body 31 centering around the shaft 35, by adjusting the magnitude of magnetic field generated by the coil 36 and adjusting magnetic attractive force that works between a permanent magnet 37 provided outside the magnetic head 30 and the coil 36.

As shown in FIGS. 7 and 8, the second actuator 33 is provided with arms 38 and 39 as an arm part, film structure bodies 41 and 42, a ferromagnetic substance 45 and a holding part 46. The film structure bodies 41 and 42 are formed on the arm 38. The ferromagnetic substance 45 is formed on the arm 39. The film structure body 10 of the first embodiment can be used as the film structure bodies 41 and 42. The holding part 46 is connected to an end part 38a of the arm 38 and an end part 39a of the arm 39, and holds the gap between the end part 38a and the end part 39a. The head 34 is connected to an end part 38b on the opposite side of the end part 38a of the arm 38, but is not connected to an end part 39b on the opposite side of the end part 39a of the arm 39. The film structure body 41 is formed on a part of the arm 38 on the opposite side of the arm 39 side, and the film structure body 42 is formed on a part of the arm 38 on the arm 39 side.

Note that the second actuator 33 may be provided with an arm 40 as an arm part and film structure bodies 43 and 44. At this time, the holding part 46 is connected to the end part 39a of the arm 39 and an end part 40a of the arm 40, and holds the gap between the end part 39a and the end part 40a. Furthermore, the head 34 is connected with an end part 40b of the arm 40 on the opposite side of the end part 40a. The film structure body 43 is formed on a part of the arm 40 on the arm 39 side, and the film structure body 44 is formed on a part of the arm 40 on the opposite side of the arm 39 side.

The film structure body 10 of the first embodiment can be used as the film structure bodies 43 and 44.

Figure 9:
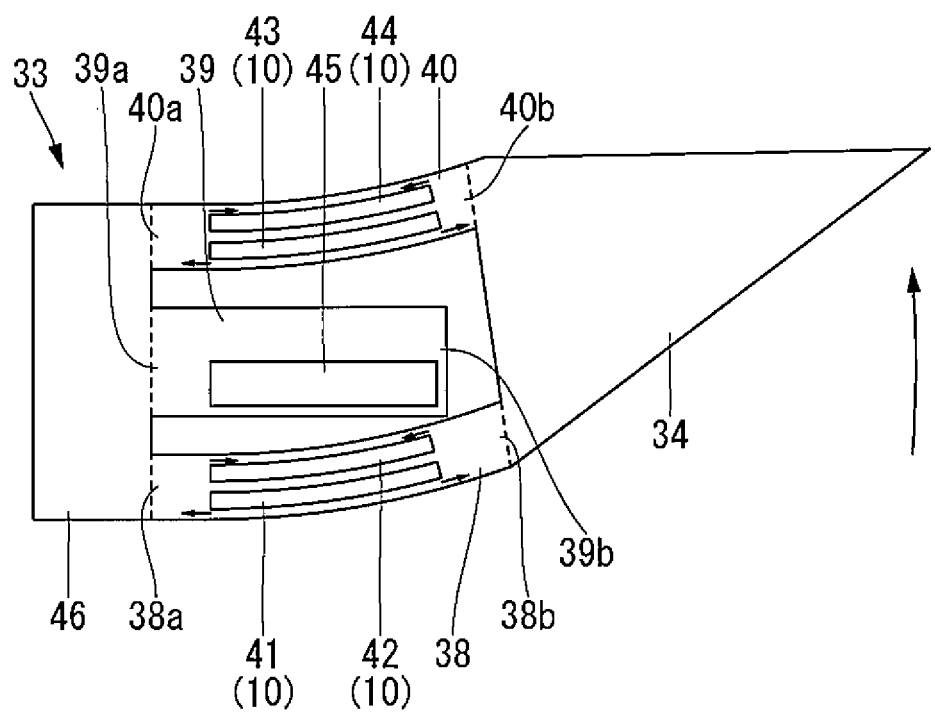
FIG. 9 is a cross-sectional view showing an operation of another example of an actuator provided with the film structure body of the first embodiment.

FIG. 9 is a cross-sectional view showing an operation of another example of an actuator provided with the film structure body of the first embodiment.

There is considered a case where a voltage is applied between the permanent magnet film 13 (refer to FIG. 1) and the electroconductive film 15 (refer to FIG. 1) so that the piezoelectric film 14 (refer to FIG. 1) extends in an in-plane direction in the film structure body 41, and a voltage is applied between the permanent magnet film 13 and the electroconductive film 15 so that the piezoelectric film 14 contracts in an in-plane direction in the film structure body 42. At this time, as shown in FIG. 9, the end part 38b of the arm 38 is displaced to the arm 39 side in the direction that is parallel to the main surface of the arm 38 and that goes from the arm 38 toward the arm 39, and the tip of the head 34 also is displaced to the arm 39 side in the direction that is parallel to the main surface of the arm 38 and that goes from the arm 38 toward the arm 39.

Note that, when the second actuator 33 is provided with the arm 40 as an arm part and the film structure bodies 43 and 44, in the film structure body 43, a voltage is applied between the permanent magnet film 13 (refer to FIG. 1) and the electroconductive film 15 (refer to FIG. 1) so that the piezoelectric film 14 (refer to FIG. 1) extends in an in-plane direction, and, in the film structure body 44, a voltage is applied between the permanent magnet film 13 and the electroconductive film 15 so that the piezoelectric film 14 contracts in an in-plane direction. At this time, as shown in FIG. 9, the end part 40b of the arm 40 is displaced to the opposite side of the arm 39 side in the direction that is parallel to the main surface of the arm 40 and that goes from the arm 39 toward the arm 40.

After that, there is considered a case where the voltage between the permanent magnet film 13 and the electroconductive film 15 is returned to 0 in the film structure bodies 41 and 42. At this time, as shown in FIG. 8, the end part 38b of the arm 38 returns to the side opposite to the arm 39 side. Note that, when the arm 40 is provided, the end part 40b of the arm 40 returns to the arm 39 side.

In the example shown in FIGS. 7 to 9, since the film structure body 42 has the permanent magnet film 13 (refer to FIG. 1), magnetic attractive force works between the permanent magnet film 13 (refer to FIG. 1) and the ferromagnetic substance 45. Furthermore, when the distance between the arm 38 and the arm 39 becomes smaller, the magnetic attractive force that works between the permanent magnet film and the ferromagnetic substance 45 becomes larger. Accordingly, when the end part 38b of the arm 38 is displaced to the arm 39 side in the direction that is parallel to the main surface of the arm 38 and that is directed toward the arm 38 and the arm 39, the displacement magnitude displaced to the arm 39 side of the arm 38 can be increased.

Note that the film structure bodies 41, 43 and 44 may not include the permanent magnet film 13. Namely, the film structure bodies 41, 43 and 44 may not be the film structure body 10 of the first embodiment.

<Motor>

Next, with reference to FIGS. 10 and 11, there will be described examples in which the film structure body of the first embodiment is applied to a motor or a car.

Figure 10:
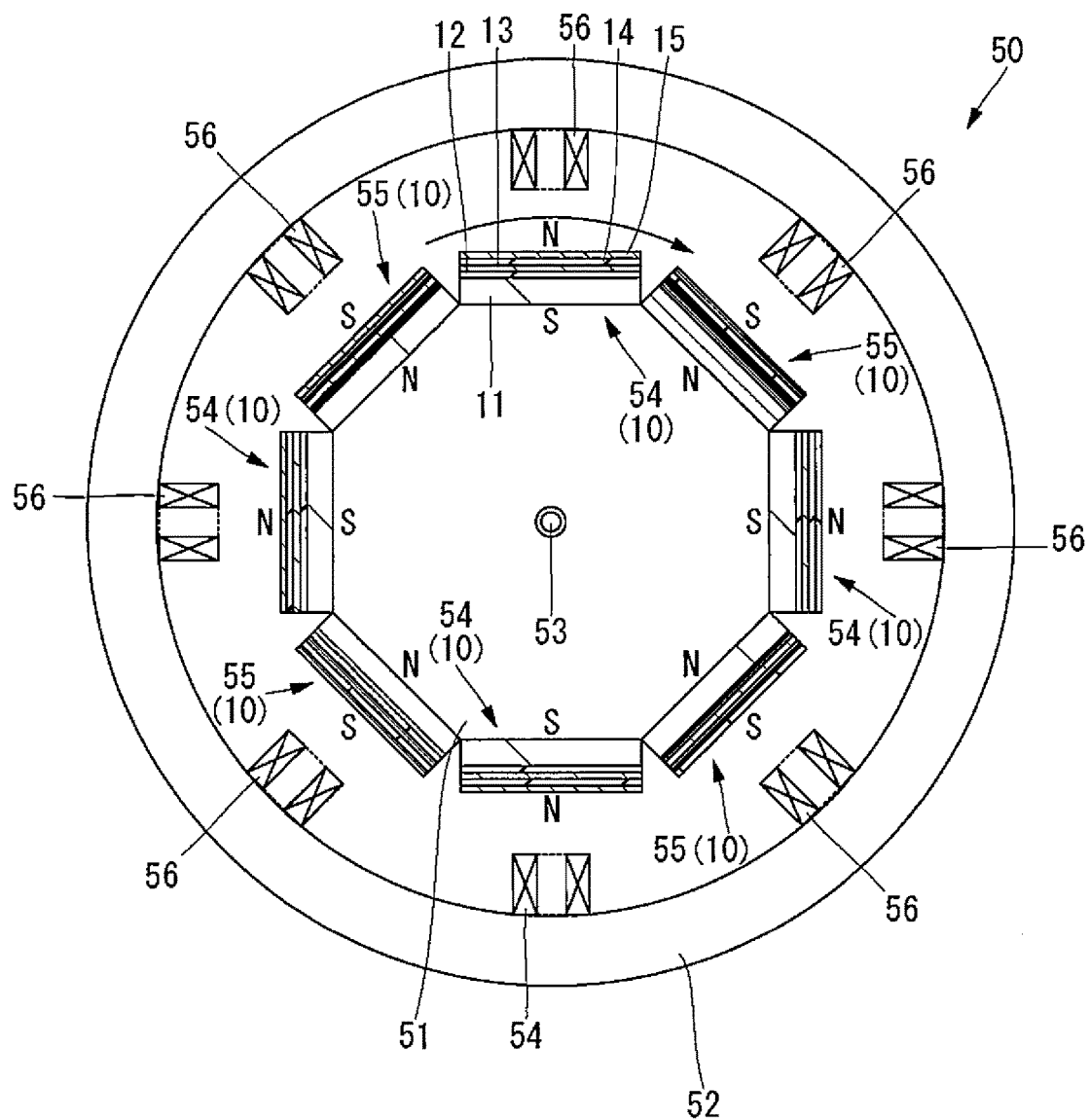
FIG. 10 is a cross-sectional view showing a motor provided with the film structure body of the first embodiment.

FIG. 10 is a cross-sectional view showing a motor provided with the film structure body of the first embodiment.

As shown in FIG. 10, a motor 50 has a rotatory part 51 and a stationary part 52. The rotatory part 51 is rotatably provided centering around a shaft 53, and has, for example, a circular or polygonal shape as a shape of a cross-section perpendicular to the shaft 53. The stationary part 52 is disposed around the rotatory part 51, and has, for example, a ring-like cross-sectional shape as a cross-sectional shape perpendicular to the shaft 53.

In a cross-section perpendicular to the shaft 53, a film structure body 54 and a film structure body 55 are alternately disposed on the side circumference surface of the rotatory part 51, along, for example, the clock-wise direction. The film structure body 10 of the first embodiment can be used as the film structure bodies 54 and 55. Furthermore, a perpendicular magnetization film can be used as the permanent magnet film 13 contained in each of the film structure bodies 54 and 55. On the other hand, the direction of magnetization of the permanent magnet film 13 contained in the film structure body 54 and the direction of magnetization of the permanent magnet film 13 contained in the film structure body 55 are opposite to each other. Accordingly, there are alternately disposed, on the side circumference surface of the rotatory part 51, the film structure body 54 having, for example, the permanent magnet film 13 with a surface of the N-pole and the film structure body 55 having, for example, the permanent magnet film 13 with a surface of the S-pole, along, for example, the clock-wise direction.

On the other hand, in a cross-section perpendicular to the shaft 53, electromagnets, that is, coils 56 are disposed at intervals mutually, along, for example, the clock-wise direction on the internal circumference surface of the stationary part 52.

As described above, the motor 50 shown in FIG. 10 is a so-called permanent magnet motor in which the rotatory part 51 contains a permanent magnet.

In the motor 50 shown in FIG. 10, a current to be flown to the coils 56 is periodically changed so that a distribution of the magnetic field generated by all the coils 56, that is, the distribution of the magnetic field in which the polarity is reversed at a constant gap along the internal circumference surface of the stationary part 52 further rotates centering around the shaft 53 along, for example, the clock-wise direction. Then, the rotatory part 51 rotates following the distribution of magnetic field that rotates centering around the shaft 53.

In addition to this, in the motor 50 shown in FIG. 10, it is possible to detect stress and vibration applied to the rotatory part 51 by using the piezoelectric film 14 contained in the film structure bodies 54 and 55 as a pressure sensor, and thus, for example, it is possible to detect, with high accuracy, rotation number and torque of the motor 50.

Moreover, there is considered a case where the motor 50 rotates at a high speed. In such a case, since the rate of change in stress applied to the piezoelectric film 14 contained in each of the film structure bodies 54 and 55 becomes larger, a detection signal can be extracted as a large signal, by the output or the like of the change in the voltage generated by a piezoelectric effect in the piezoelectric film 14 through the use of a differentiating circuit. Therefore, detection accuracy of the rotation number and torque of the motor 50 can be enhanced.

Note that the case where the stationary part 52 is provided around the rotatory part 51 is not a limited case. Accordingly, the rotatory part 51 may be provided around the stationary part 52. Further, the case where the rotatory part 51 is provided with the film structure bodies 54 and 55 and the stationary part 52 is provided with the coil 56 is not a limited case. Accordingly, the stationary part 52 may be provided with the film structure bodies 54 and 55 and the rotatory part 51 may be provided with the coil 56.

Figure 11:
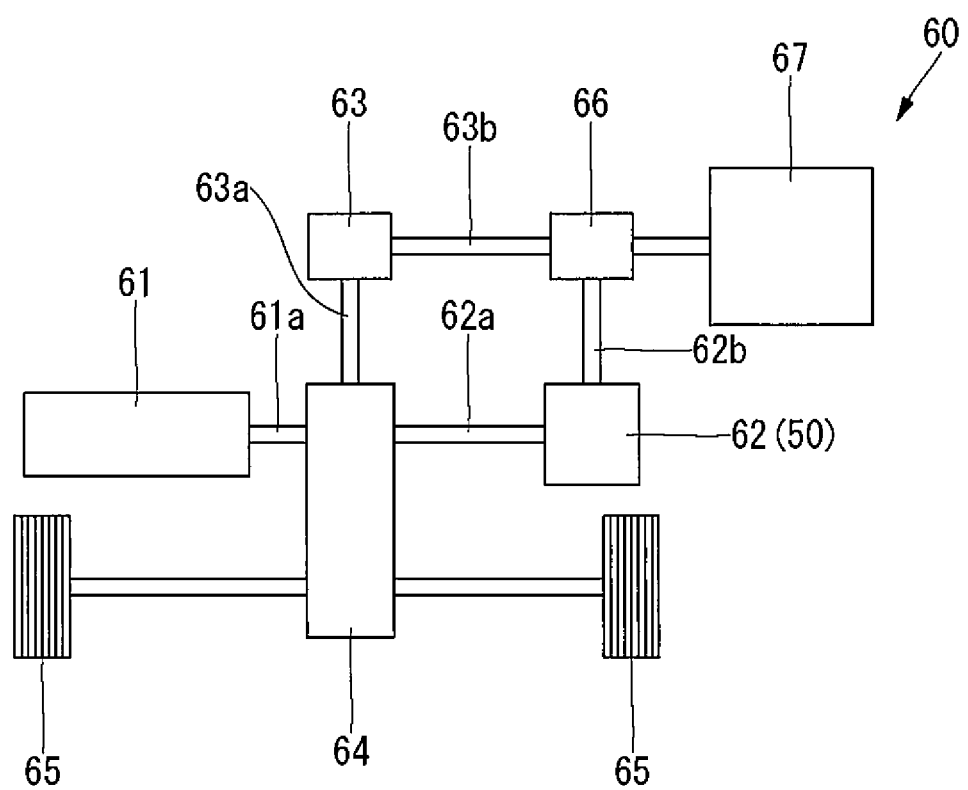
FIG. 11 is a drawing showing a car provided with a motor having the film structure body of the first embodiment.

FIG. 11 is a drawing showing a car provided with a motor having the film structure body of the first embodiment.

As shown in FIG. 11, a car 60 has an engine 61, a motor 62, a generator 63, a power transfer switching device 64, wheels 65, a charge/discharge switching device 66 and a battery 67. Power 61*a* output from the engine 61, power 62*a* output from the motor 62, and power 63*a* input to the generator 63 are transferred between these and the wheels 65 via the power transfer switching device 64. Electric power 62*b* input to the motor 62 and electric power 63*b* output from the generator 63 are charged between the generator 63 and the battery 67 or discharged between the motor 62 and the battery via the charge/discharge switching device 66. Alternatively, the electric power 63*b* output from the generator 63 is input to the motor 62 as the electric power 62*b* via the charge/discharge switching device 66. For example, an inverter can be used as the charge/discharge switching device 66.

In this way, the car shown in FIG. 11 is a so-called hybrid car. When the car 60 starts or while the car 60 is ordinarily running, connection states of the power transfer switching device 64 and the charge/discharge switching device 66 are switched, and the power 61*a* output from the engine 61 or the power 62*a* output from the motor 62 by the electric power from the battery 67 is transferred to the wheels 65. Alternatively, there is a case where the power 61*a* output from the engine 61 is input to the generator 63 as the power 63*a* via the power transfer switching device 64, the electric power 63*b* output from the generator 63 is input to the motor 62 as the electric power 62*b* via the charge/discharge switching device 66, and the power 62*a* output from the motor 62 is transferred to the wheels 65. On the other hand, when the car 60 decelerates or stands still, connection states of the power transfer switching device 64 and the charge/discharge switching device 66 are switched, the power transferred from the wheels 65 is input to the motor 62 as the power 62*a*, and the electric power 62*b* output from the motor 62 working as a generator is charged to the battery 67 via the charge/discharge switching device 66.

The motor 50 shown in FIG. 10 can be used as the motor 62 included in the car 60 shown in FIG. 11. Accordingly, since the rotation number and torque of the motor 62 can be detected with high accuracy, timing for switching the power transfer switching device 64 and the charge/discharge switching device 66 can be controlled with high accuracy. Consequently, for example, travelling performances such as fuel consumption and acceleration performance of the car 60 can be enhanced.

<Magnetic Shield Structure>

Figure 12:
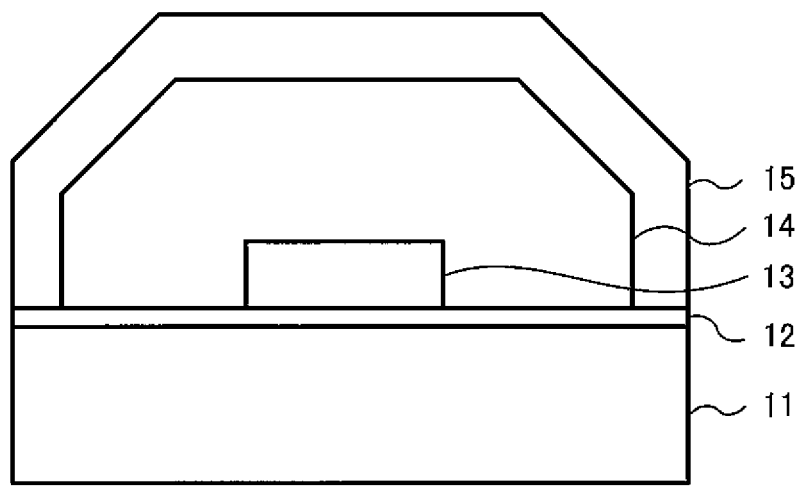
FIG. 12 is a cross-sectional view schematically showing a piezoelectric body element according to an aspect of the present invention.

FIG. 12 is a cross-sectional view schematically showing a piezoelectric element according to an aspect of the present invention, and the piezoelectric element has magnetic shield. The alignment film 12 oriented to a prescribed plane is formed on the substrate 11, and the lower electrode (electroconductive film) 13 is formed on the alignment film 12. The epitaxially grown piezoelectric film 14 is formed on the lower electrode 13 and the alignment film 12, and the upper electrode 15 constituted of a ferromagnetic film is formed on the piezoelectric film 14, so as to cover the piezoelectric film 14.

According to the piezoelectric element in FIG. 12, it is possible to impart the piezoelectric element to a magnetic shield effect by forming the upper electrode 15 through the use of a ferromagnetic film and by covering the piezoelectric film 14 with the upper electrode 15.

Figure 13:
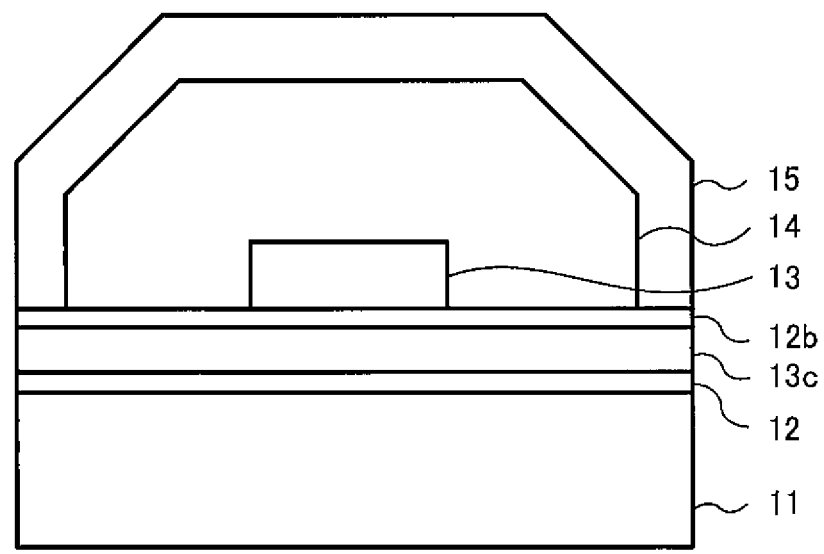
FIG. 13 is a cross-sectional view schematically showing a piezoelectric body element according to an aspect of the present invention.

FIG. 13 is a cross-sectional view schematically showing a piezoelectric element according to an aspect of the present invention, in which the piezoelectric element has a magnetic shield. The alignment film 12 oriented to a prescribed plane is formed on the substrate 11, and a ferromagnetic film 13c is formed on the alignment film 12. An insulating film 12b is formed on the ferromagnetic film 13c, and the lower electrode (electroconductive film) 13 is formed on the insulating film 12b. The epitaxially grown piezoelectric film 14 is formed on the lower electrode 13 and the insulating film 12b, and the upper electrode 15 constituted of a ferromagnetic film is formed on the piezoelectric film 14 so as to cover the piezoelectric film 14.

According to the piezoelectric element in FIG. 13, it is possible to impart the piezoelectric element to a magnetic shield effect by forming the piezoelectric film 14 on the ferromagnetic film 13c and by covering the piezoelectric film 14 with the upper electrode 15 constituted of a ferromagnetic film.

<Piezoelectric Magnet Motor>

Figure 14A:
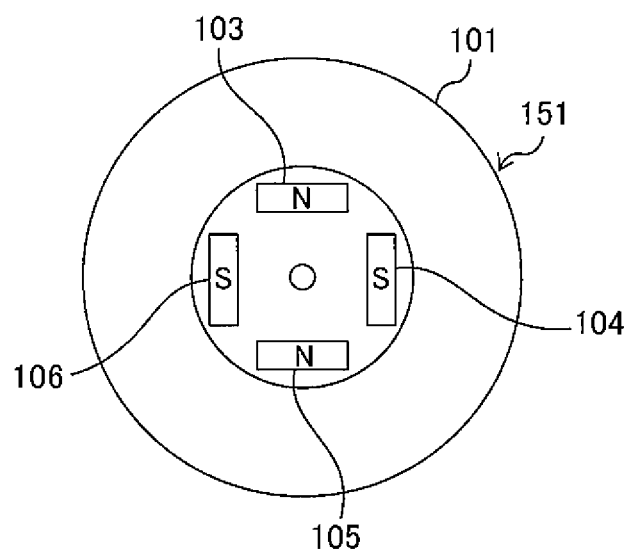
FIGS. 14A to 14C are plan views describing a piezoelectric magnet motor provided with a piezoelectric stepping motor and a permanent magnet motor.
Figure 14B:
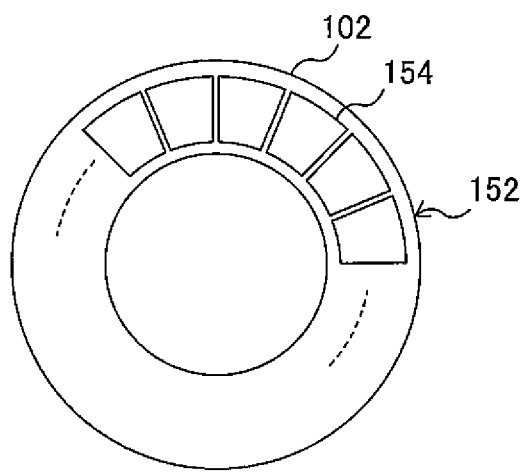
Figure 14C:
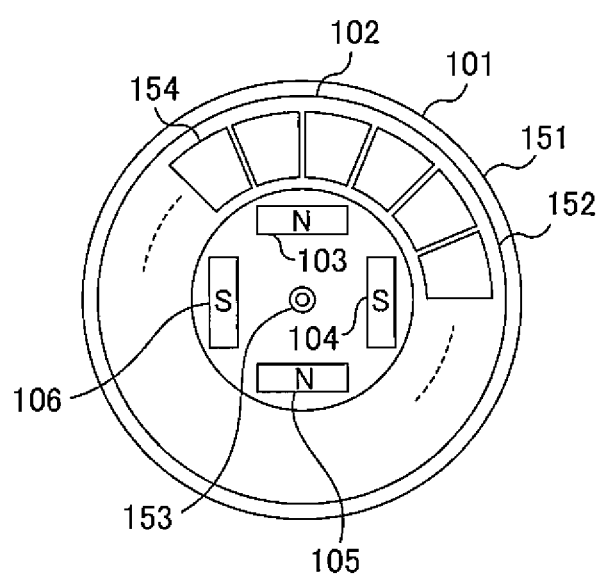

FIG. 14 is a plan view describing a piezoelectric magnet motor provided with a piezoelectric stepping motor and a permanent magnet motor. FIG. 14A is a plan view showing a rotatory part containing a rotor and a permanent magnet, FIG. 14B is a plan view showing a stationary part containing a piezoelectric element and an electromagnet, and FIG. 14C is a plan view showing a piezoelectric magnet motor obtained by overlapping the rotatory part shown in FIG. 14A and the stationary part shown in FIG. 14B.

Figure 15:
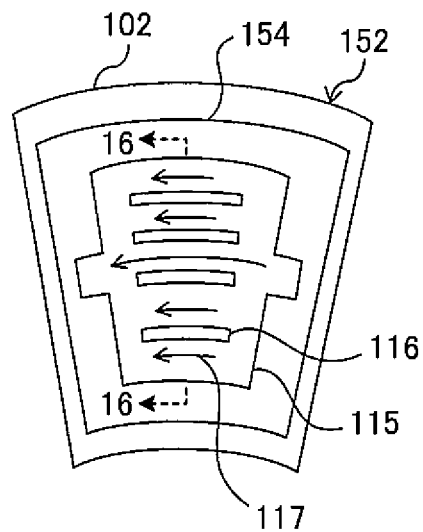
FIG. 15 is a plan view obtained by expanding a part of the stationary part shown in FIG. 14B.

FIG. 15 is a plan view obtained by enlarging a part of the stationary part shown in FIG. 14B.

Figure 16:
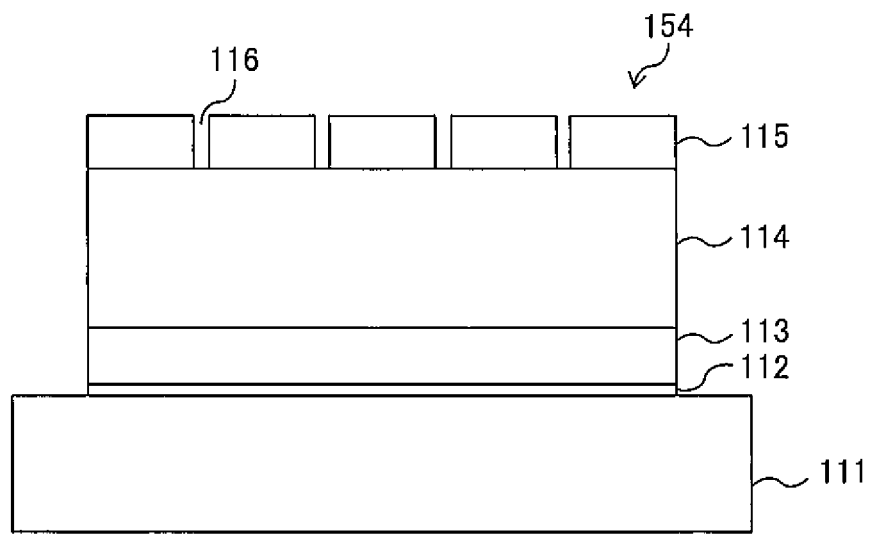
FIG. 16 is a cross-sectional view along the 16-16 line shown in FIG. 15.

FIG. 16 is a cross-sectional view along the 16-16 line shown in FIG. 15.

As shown in FIG. 14A, a rotatory part 151 has a circular planar shape, and a ring-shaped rotor 101 is disposed on the outer circumference of the rotatory part 151. The rotor 101 has a comb-tooth-part of a concave-convex-part structure regularly arranged at a prescribed pitch (refer to FIG. 17). Inside the rotor 101, an N-pole permanent magnet 103, an S-pole permanent magnet 104, an N-pole permanent magnet 105, and an S-pole permanent magnet 106 are alternately disposed on the circumference of a circle. A permanent magnet film obtained by magnetizing the ferromagnetic film according to the first embodiment can be used as these permanent magnets 103 to 106. In that case, the magnetization direction of the N-pole permanent magnets 103 and 105 and the magnetization direction of the S-pole permanent magnets 104 and 106 are mutually opposite to each other.

As shown in FIG. 14B, a stationary part 152 has a stator 102 having a ring-like planar shape, and a plurality of piezoelectric elements 154 is disposed on the stator 102, along the ring-like shape. The stator 102 has a comb-tooth part of a concave-convex-part structure regularly arranged at a prescribed pitch (refer to FIG. 17). As shown in FIG. 16, the piezoelectric element 154 has a silicon substrate 111, and, an alignment film 112 oriented to a prescribed plane is formed on the silicon substrate 111. A ferromagnetic film (lower electrode) 113 is formed on the alignment film 112, and a piezoelectric film 114 is formed on the ferromagnetic film 113. a ferromagnetic film (upper electrode) 115 is formed on the ferromagnetic film 114, and, as shown in FIG. 15, the ferromagnetic film 115 has a pattern shape provided with an opening part 116. A reason for having such opening part 116 is that a current is flown to the ferromagnetic film 115 in the direction of an arrow 117 or in the opposite direction of the arrow 117. Accordingly, the ferromagnetic film 115 works as an electromagnet. Namely, an electromagnet is disposed to each of the piezoelectric elements 154 and the electromagnets are disposed on the circumference of a circle with a gap each other. Note that a protective film (not shown) may be formed on the ferromagnetic film 115. Furthermore, the film structure body 10 according to the present embodiment can be used as the piezoelectric element 154.

In addition, in FIG. 16, a ferromagnetic film is used for both the upper electrode 115 and the lower electrode 113, and a ferromagnetic film having a pattern shape provided with the opening part 116 is used for the upper electrode 115, but this is not a limited case. The use of a ferromagnetic film for both the upper electrode 115 and the lower electrode 113 and the use of a ferromagnetic film having a pattern shape provided with an opening part for the lower electrode 113 are acceptable, and a configuration in which a ferromagnetic film having a pattern shape provided with an opening part is used for one of the upper electrode 115 and the lower electrode 113 and an electroconductive film is used for the other, is also acceptable.

Figure 17:
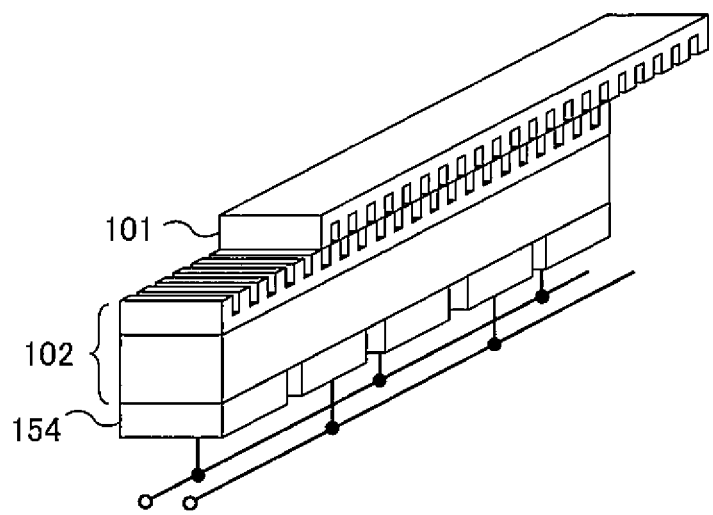
FIG. 17 is a schematic view showing a part of the piezoelectric magnet motor shown in FIG. 14C.

In the piezoelectric magnet motor shown in FIG. 14C, the stationary part 152 shown in FIG. 14B is disposed to be overlapped on the rotatory part 151 shown in FIG. 14A. The rotatory part 151 is rotatably provided centering around a shaft 153. The outer circumference of the piezoelectric magnet motor is, as shown in FIG. 17, in a state where the stator 102 is disposed on the piezoelectric element 154, and the rotor 101 is disposed on the stator 102.

As described above, the piezoelectric magnet motor shown in FIG. 14C has a permanent magnet motor including the permanent magnets 103 to 106 of the rotatory part 151 and an electromagnet of the stationary part 152. A current to be flown to the ferromagnetic film 115 is periodically changed so that, for example, along the clock-wise direction, a distribution of a magnetic field generated by the ferromagnetic film 115 of all the piezoelectric elements 154, that is, the distribution of a magnetic field in which the polarity is reversed at a constant gap along the internal circumference surface of the stationary part 152 further rotates centering around the shaft 153. Then, the rotatory part 151 rotates following the distribution of magnetic field that rotates centering around the shaft 153. The permanent magnet motor operates in this way. Note that the current to be flown to the ferromagnetic film 115 is supplied from a power source (not shown) and the power source is controlled by a control unit (not shown).

Figure 18:
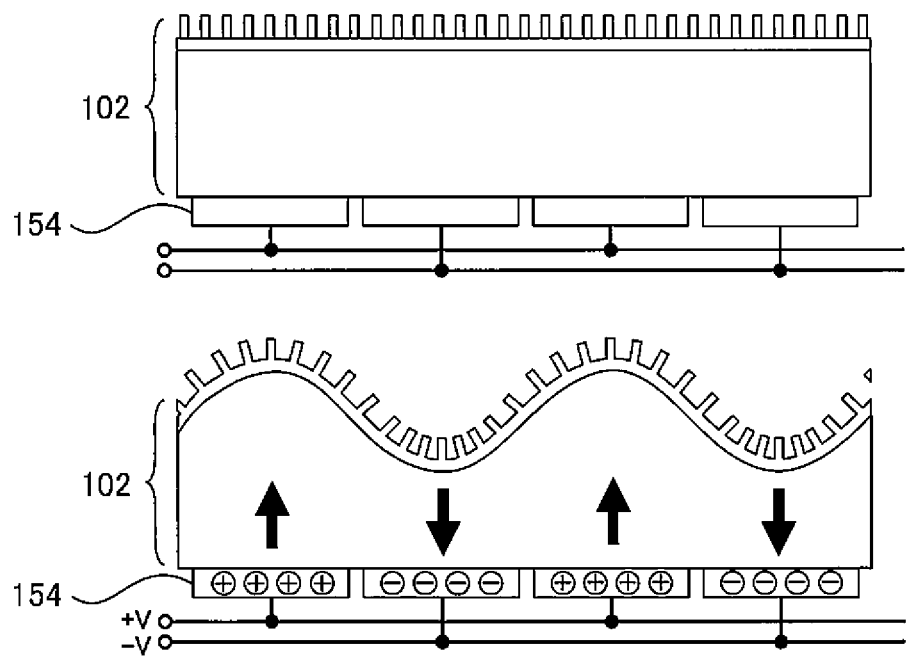

In addition to this, in the piezoelectric magnet motor shown in FIG. 14C, the rotatory part 151 can be rotated through the use of the piezoelectric film 114 contained in the piezoelectric element 154 as a piezoelectric stepping motor. In detail, as shown in FIG. 18, the piezoelectric element 154 is expanded or contracted by alternate application of a plus voltage and a minus voltage between the upper electrode 115 and the lower electrode 113 of the piezoelectric element 154 shown in FIG. 16. Accordingly, the expansion or contraction of the stator 102 causes the rotor 101 to move while the comb-tooth part of concave-convex-part structure of the stator 102 engages with the comb-tooth part of concave/convex structure of the rotor 101, and as the result, the rotatory part 151 can be rotated centering around the shaft 153 shown in FIG. 14C (refer to FIG. 17). Note that, since FIGS. 17 and 18 show in detail a part of FIG. 14C, they give drawings in which the rotor 101 and the stator 102 are formed in a linear manner, but as shown in FIG. 14C, the rotor 101 and the stator 102 have a shape disposed on the circumference of a circle. In this way, the piezoelectric stepping motor operates.

According to the above-described piezoelectric magnet motor, it is possible to freely control rotatory power and rotation speed by simultaneously or individually using the piezoelectric stepping motor and the permanent magnet motor. For example, the piezoelectric stepping motor is suitable for rapid and powerful rotation, and the permanent magnet motor is suitable for high-speed rotation. Accordingly, it is possible to realize motors usable for various applications by combining the piezoelectric stepping motor and the permanent magnet motor.

More detailed description will be given.

A piezoelectric stepping motor (ultrasonic motor) is a motor in which a rotor is moved through the use of ultrasonic waves (frequency of 20 kHz or higher) inaudible to human ears. An ultrasonic motor uses a piezoelectric element for generating ultrasonic waves, and a piezoelectric element expands or contracts depending on directions of electric potential when plus/minus potential difference is given to two terminals. Ultrasonic waves are generated by the expansion and contraction.

How the ultrasonic motor operates will be described.

First, as shown in FIG. 14B, the piezoelectric elements 154 are stuck, at regular intervals, on a plane of a circular metal plate referred to as the stator 102, and as shown in the upper view of FIG. 18, the piezoelectric elements 154 are connected every other element and an electrode is given. When plus and minus electric potentials are alternately given (a sine wave) to the electrode, the piezoelectric element 154 vibrates up and down as shown in the lower view in FIG. 18, and the vibration transmits to the combtooth part of concave-convex-part structure regularly arranged on the opposite plane of the stator. Namely, as the sine-wave of plus/minus voltage applied between electrodes travels to the right, protrusions of the comb-tooth part move up and down one after another, and when the top of the protrusion is pursued, anticlockwise elliptic movement is observed.

The rotor 101 is disposed so as to make contact with the comb teeth on the stator 102 as in FIGS. 17 and 14C. The rotary shaft 153 is disposed at the central part of the rotor 101. The rotor 101 rotates in the direction opposite to the moving direction. This is the outline of operation principle of the ultrasonic motor.

<Method for Manufacturing a Film Structure Body>

Next, there will be described a method for manufacturing a film structure body of the first embodiment with reference to FIGS. 19 to 22. FIGS. 19 to 22 are cross-sectional views in a manufacturing process of the film structure body of the first embodiment.

Figure 19:
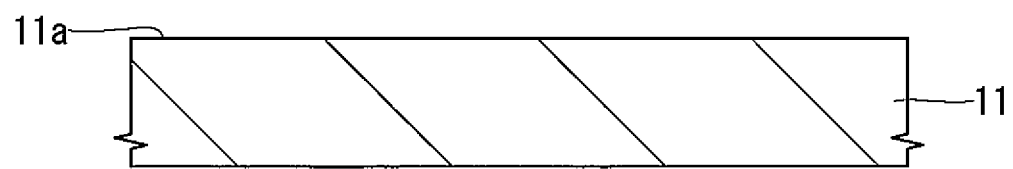
FIG. 19 is a cross-sectional view in a manufacturing process of the film structure body of the first embodiment.

First, as shown in FIG. 19, the substrate 11 is prepared (Step S1).

In Step S1, the substrate 11 constituted of a silicon single crystal is prepared. Furthermore, suitably, the substrate 11 constituted of a silicon single crystal has a cubic crystal structure and has the upper surface 11a as a main surface constituted of a (100) plane. Note that an oxide film such as a $SiO_2$ film may be formed on the upper surface 11a of the substrate 11.

Figure 20:
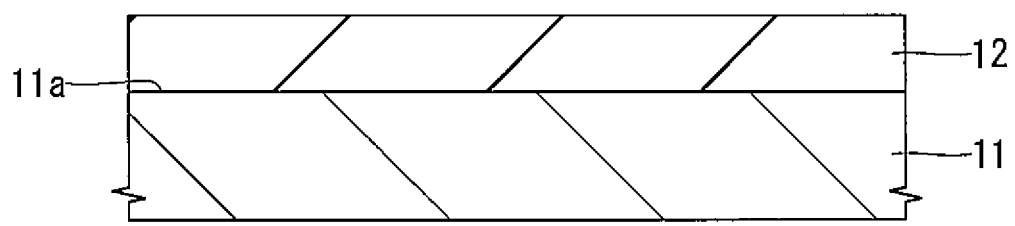
FIG. 20 is a cross-sectional view in a manufacturing process of the film structure body of the first embodiment.

Next, as shown in FIG. 20, the alignment film 12 is formed on the substrate 11 (Step S2). Hereinafter, there will be exemplified and described a case where the alignment film 12 is formed through the use of an electron beam vapor deposition method, but the film can be formed through the use of various methods such as a sputtering method.

In Step S2, first, in a state where the substrate 11 is disposed in a certain vacuum atmosphere, the substrate 11 is heated to 700° C. or higher (preferably 800° C. or higher).

In Step S2, next, Zr is vaporized by an electron beam vapor deposition method using an deposition material of a Zr single crystal. At this time, a $ZrO_2$ film is formed by the reaction of vaporized Zr with oxygen on the substrate 11 heated to 700° C. or higher. Then, the alignment film 12 constituted of a $ZrO_2$ film as a single layer film is formed.

As described above using FIG. 1, the alignment film 12 is epitaxially grown on the upper surface 11a constituted of a (100) plane, as the main surface of the substrate 11 constituted of a silicon single crystal. The alignment film 12 has a cubic crystal structure and contains (100)-oriented zirconium oxide ($ZrO_2$). Namely, the alignment film 12 constituted of a single layer film containing a (100)-oriented $ZrO_2$ film is formed on the upper surface 11a constituted of a (100) plane of the substrate 11 constituted of a silicon single crystal.

As described above, two directions orthogonal to each other in the upper surface 11a constituted of a (100) plane of the substrate 11 constituted of a silicon single crystal are defined as the X-axis direction (refer to FIG. 1) and the Y-axis direction (refer to FIG. 1), and the direction perpendicular to the upper surface 11a is defined as the Z-axis direction (refer to FIG. 1). At this time, the fact that that "a film grows epitaxially" means that the film is preferably oriented to any direction of the X-axis direction, the Y-axis direction and the Z-axis direction.

Thickness of the alignment film 12 is preferably 2 nm to 100 nm, more preferably 10 nm to 50 nm. As the result of having such film thickness, there can be formed the alignment film 12 that is epitaxially grown and is extremely close to a single crystal.

Alternatively, as the alignment film 12, the alignment film 12 as a laminated film may be formed on the substrate 11 instead of the alignment film 12 constituted of a single layer film. In this case, in Step S2, in a state where the substrate 11 is disposed in a certain vacuum atmosphere, the substrate 11 is heated to 700° C. or higher (preferably 800° C. or higher) and, Zr is vaporized by an electron beam vapor deposition method using an deposition material of a Zr single crystal. At this time, the vaporized Zr is formed, as a Zr film, on the upper surface 11a constituted of a (100) plane as the main surface of the substrate 11 heated to 700° C. or higher. The thickness of the Zr film is, for example, preferably 0.2 to 30 nm, more preferably 0.2 nm to 5 nm.

When the alignment film 12 as a laminated film is to be formed, next, Zr is vaporized by an electron beam vapor deposition method using an deposition material of a Zr single crystal, and, a $ZrO_2$ film is formed by a reaction of the vaporized Zr with oxygen on the Zr film of the substrate 11 heated to 700° C. or higher.

When the alignment film 12 as a laminated film is to be formed, next, Y is vaporized by an electron beam vapor deposition method using an deposition material of Y, and, a $Y_2O_3$ film is formed, by a reaction of the vaporized Y with oxygen, on the $ZrO_2$ film of the substrate 11 heated to 700° C. or higher.

After repetition of the formation of the $ZrO_2$ film and the $Y_2O_3$ film N times (N is an integer of not less than 1), in this way, a $ZrO_2$ film is formed on a $Y_2O_3$ film by the same method as described above. Accordingly, there is formed the alignment film 12, in which a $ZrO_2$ film and a $Y_2O_2$ film are alternately laminated and which has a vertically symmetric sandwich structure obtained so that $ZrO_2$ films sandwich a $Y_2O_3$ film from the upper and lower sides. Even when an Yttria stabilized Zirconia (YSZ) film, which is a very hard and brittle substance having a Young's modulus of 522 GPa, is formed by thermal diffusion at the junction part of the ZrO$_2$ film and the Y$_2$O$_3$ film, warp of the YSZ film due to stress can be avoided by formation of the vertically symmetric sandwich structure.

Figure 21:
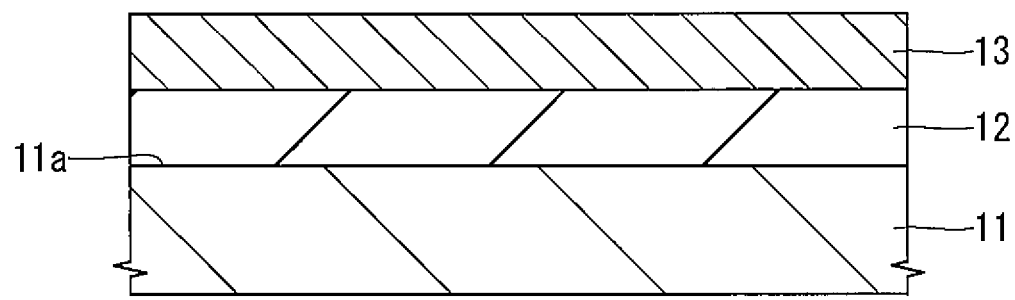
FIG. 21 is a cross-sectional view in a manufacturing process of the film structure body of the first embodiment.

Next, as shown in FIG. 21, the permanent magnet film 13 is formed on the alignment film 12 (Step S3). Hereinafter, a method for forming the permanent magnet film 13 using a sputtering method will be exemplified and described, but the film can be formed through the use of various methods such as an electron beam vapor deposition method.

In Step S3, the permanent magnet film 13 is deposited on the alignment film 12 by, for example, a sputtering method. At this time, the temperature of the substrate 11 in film deposition is set to a temperature not less than the lower limit value of a temperature range in which the deposited permanent magnet film 13 crystallizes, and the permanent magnet film 13 made into a crystal may be directly formed. Alternatively, the temperature of the substrate 11 in the film formation is set to a temperature less than the lower limit value of temperature range in which the formed permanent magnet film 13 crystallizes, and, after depositing the permanent magnet film 13, a heat treatment is performed on the substrate 11 at a temperature not less than the lower limit value of a temperature range in which the deposited permanent magnet film 13 crystallizes, to thereby crystallize the permanent magnet film 13.

Furthermore, when the temperature of the substrate 11 in the film formation is set to a temperature not less than the lower limit value of a temperature range in which the permanent magnet film 13 crystallizes, the substrate 11 is desirably disposed in a vacuum or in an inert gas atmosphere so that the permanent magnet film 13 is not oxidized. Moreover, a time period of heat treatment for crystallizing the formed permanent magnet film 13 differs depending on the temperature of the substrate 11 in the heat treatment, that is, heat treatment temperature, and when the heat treatment temperature is, for example, 650° C., a heat treatment for approximately 0.2 to 2 hours is preferably performed.

A permanent magnet film containing a rare-earth element, that is, a permanent magnet film constituted of a rare-earth magnet can be used as the permanent magnet film 13. Alternatively, a permanent magnet film other than a rare-earth magnet can be used as a permanent magnet film.

Suitably, there can be used, as the permanent magnet film 13 constituted of a rare-earth magnet, a permanent magnet film containing at least one rare-earth magnets selected from the group consisting of R—Fe—B-based rare-earth magnets such as R$_2$Fe$_{14}$B, R—Co-based rare-earth magnets such as RCo$_5$ and R$_2$ (CO, Fe, Cu, Zr)$^{17}$, and R—Fe—N-based rare-earth magnets such as R$_2$Fe$_{17}$N$_3$ and RFe$_7$N$_x$, when a rare-earth element is denoted by R. Accordingly, residual magnetization perpendicular to the surface of the permanent magnet film 13 can be made larger than in cases where a permanent magnet film other than the rare-earth magnet is used.

Note that R—Fe—B-based rare-earth magnets are easily made into an amorphous state, desirably they are crystallized by control of the substrate temperature in the film deposition to a range of not less than 300° C. to not more than 800° C., or by a heat treatment at not less than 400° C. to not more than 800° C. after the film deposition.

When the permanent magnet film 13 contains R$_2$Fe$_{14}$B, as described above, the permanent magnet film 13 suitably has a tetragonal crystal structure and is (001)-oriented. Since a (001)-oriented R$_2$Fe$_{14}$B easily becomes a perpendicular magnetization film having magnetization perpendicular to the surface of the permanent magnet film 13, the residual magnetization of the permanent magnet film 13 can be further increased.

When the permanent magnet film 13 contains RCo$_5$, the permanent magnet film 13 suitably has a hexagonal crystal structure and is (11-20)-oriented as described above. A (11-20)-oriented RCo$_5$ easily becomes a perpendicular magnetization film having magnetization parallel to the surface of the permanent magnet film 13, but the residual magnetization of the permanent magnet film 13 can be further increased since magnetization perpendicular to the surface of the permanent magnet film 13 also becomes large to some extent.

When the permanent magnet film 13 contains R$_2$ (Co, Fe, Cu, Zr)$_{17}$, the permanent magnet film 13 suitably has a hexagonal crystal structure and is (11-20)-oriented, as described above. Although a (11-20)-oriented R$_2$ (Co, Fe, Cu, Zr)$_{17}$ easily becomes a perpendicular magnetization film having magnetization parallel to the surface of the permanent magnet film 13, magnetization perpendicular to the surface of the permanent magnet film 13 also becomes large to some extent, and thus the residual magnetization of the permanent magnet film 13 can be further increased.

On the other hand, there can be used, as a permanent magnet film other than rare-earth magnets, a permanent magnet film constituted of at least one selected from the group consisting of Al—Ni—Co-based magnets such as a Ni magnet and Al—Ni—Co alloy, Fe—Pt-based magnets such as Fe$_3$Pt, FePt and FePt$_3$, Fe—Cr—Co-based magnets, Sr ferrite magnets and Co—Fe—B-based magnets.

When the permanent magnet film 13 contains Ni, the permanent magnet film 13 suitably has a cubic crystal structure and is (100)-oriented, as described above. In Ni having a cubic crystal structure, since residual magnetization along the [100] direction can be obtained, the residual magnetization of the permanent magnet film 13 can be further increased.

A method for performing a heat treatment of the substrate 11 when the permanent magnet film 13 is to be formed is arbitrary, and, for example, the substrate 11 may be heat-treated directly or indirectly by a sheath heater or an infrared lamp heater. Moreover, in a case where the substrate 11 is heat-treated after the formation of the permanent magnet film 13, the substrate 11 is desirably heat-treated in a vacuum atmosphere or in an inert gas atmosphere so that the permanent magnet film 13 is not oxidized. A time period for performing the heat treatment also differs depending on the treatment temperature when the heat treatment is performed, and, for example, when the heat treatment temperature is 650° C., a heat treatment for approximately 0.2 to 2 hours is preferably performed.

Note that, even when the target for depositing the permanent magnet films 13 has a fixed composition, the composition of the permanent magnet film 13 can be changed depending on a lattice constant of the alignment film 12 in an in-plane direction and conditions for forming the permanent magnet film 13, and the symmetric property and orientation direction of the crystal of the permanent magnet film 13 can be changed along with the change of the composition.

Accordingly, when the permanent magnet film 13 contains R$_2$Fe$_{14}$B, the permanent magnet film 13 can also contain tetragonal (100)-oriented R$_2$Fe$_{14}$B, instead of tetragonal (001)-oriented R$_2$Fe$_{14}$B. Alternatively, when the permanent magnet film 13 contains RCo$_5$ or R$_2$ (CO, Fe, Cu, Zr)$_{17}$, the permanent magnet film 13 can also contain hexagonal (0001)-oriented $RCo_5$ or $R_2(Co, Fe, Cu, Zr)_{17}$, instead of hexagonal (11-20)-oriented $RCo_5$ or $R_2(Co, Fe, Cu, Zr)_{17}$.

In addition, when the direction in which the permanent magnet film 13 is easily magnetized is perpendicular to the surface of the permanent magnet film 13, a perpendicular magnetization film is easily obtained, and when the direction in which the permanent magnet film 13 is easily magnetized is parallel to the surface of the permanent magnet film 13, an in-plane magnetization film is easily obtained. Accordingly, the magnetization direction of the permanent magnet film 13 can be aligned, and the magnitude of the magnetization of the permanent magnet film 13 can be easily made larger.

Figure 22:
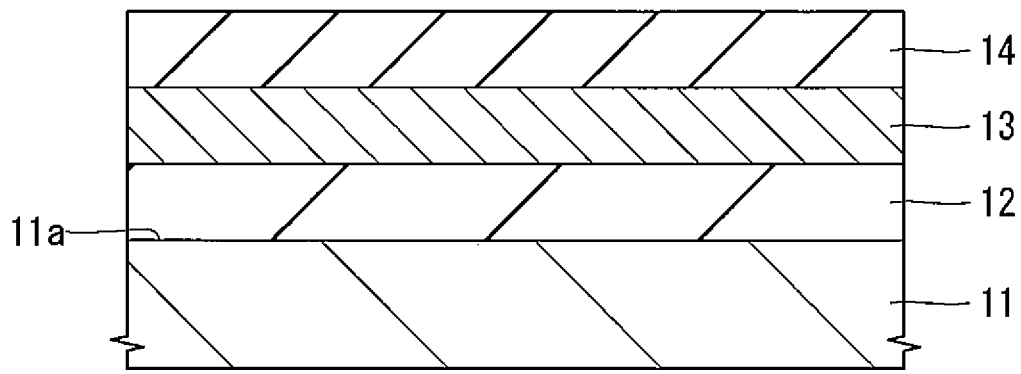
FIG. 22 is a cross-sectional view in a manufacturing process of the film structure body of the first embodiment.

Next, as shown in FIG. 22, the piezoelectric film 14 is formed on the permanent magnet film 13 (Step S4). Hereinafter, a method of forming the piezoelectric film 14 using an application method will be exemplified and described.

In Step S4, an amorphous PZT film having a stoichiometric composition, or an amorphous PZT film containing lead in a content of less than the content of lead in an amorphous PZT film having a stoichiometric composition is formed on the permanent magnet film 13. Next, the piezoelectric film 14 containing PZT is formed on the permanent magnet film 13 by heat-treatment of the amorphous PZT film in a pressurized oxygen atmosphere and by crystallization of the amorphous PZT film. Note that, when the content of lead in the amorphous PZT film having the stoichiometric composition is defined as 100% by atom, a content of lead of less than the content of lead in the amorphous PZT film having the stoichiometric composition is suitably 80 to 95% by atom.

Hereinafter, a method for forming an amorphous PZT film will be described.

First, a sol-gel solution for forming an amorphous PZT film is prepared. There can be prepared, as the sol-gel solution for forming an amorphous PZT film, a solution E1 containing butanol as a solvent and lead in an amount deficient by 70 to 90%, and having a concentration of 10% by weight.

An alkaline alcohol having an amino group such as dimethylamino ethanol is added to the E1 solution, at a volume ratio of E1 solution:dimethylamino ethanol=7:3. Accordingly, pH becomes 12 and the E1 solution exhibiting a strong alkalinity can be obtained.

Next, an amorphous PZT film is formed by a spin-coating method using the E1 solution. The substrate 11 is held by a substrate-holding part that is included in a spin coater and is rotatably provided, and a certain amount of the E1 solution is applied to the surface of the permanent magnet film 13, which is, after that, first rotated at 800 rpm for 5 seconds, rotated at 1500 rpm for 10 seconds, then the rotation number thereof is gradually increased to 3000 rpm in 10 seconds and thus the substrate 11 is coated with the E1 solution. Next, the substrate 11 coated with the E1 solution is left to stand for 5 minutes on a hot plate whose temperature is controlled at 150° C., is left to stand for 10 minutes on a hot plate whose temperature is controlled at 300° C., then is cooled to room temperature. An amorphous PZT film having, for example, a thickness of 200 nm can be formed on the permanent magnet film 13 by repetition of this 5 times.

Subsequently, the amorphous PZT film is heat-treated in a pressurized oxygen atmosphere. Accordingly, the piezoelectric film 14 in which the amorphous PZT film has been crystallized is formed on the permanent magnet film 13.

Note that, even when the E1 solution has a fixed composition, the composition of the piezoelectric film 14 can be changed depending on the lattice constant of the permanent magnet film 13 in an in-plane direction and conditions for depositing the permanent magnet film 13, and a symmetric property or orientation direction of the crystal in the piezoelectric film 14 can be changed along with the change in the composition. For example, even in cases where an amorphous PZT film has a composition formula represented by $PbZr_xTi_{1-x}O_3$ (0<x<1) and has, as Zr/Ti, any of compositions of 58/42 (x=0.58), 52/48 (x=0.52) and 42/58 (x=0.42), the formed piezoelectric film 14 has, as Zr/Ti, 55/45 which is originally a composition for giving a rhombohedral crystal structure, but can have a tetragonal crystal structure and can be (001)-oriented.

Furthermore, in the above-described example, a method of forming the piezoelectric film 14 by using a coating method is exemplified and described, but a method for forming the piezoelectric film 14 is not limited to a coating method. Therefore, the piezoelectric film 14 may be formed through the use of a sputtering method.

When the piezoelectric film 14 is formed through the use of a sputtering method, and even when a sputtering target has a fixed composition, the composition of the piezoelectric film 14 can be changed depending on the lattice constant of the permanent magnet film 13 in an in-plane direction and conditions for forming the permanent magnet film 13, and a symmetric property or orientation direction of the crystal in the piezoelectric film 14 can be changed along with the change in the composition. For example, even in cases where a sputtering target has a composition formula represented by $PbZr_xTi_{1-x}O_3$ (0<x<1) and has, as Zr/Ti, any of compositions of 58/42 (x=0.58), 52/48 (x=0.52) and 42/58 (x=0.42), the formed piezoelectric film 14 has, as Zr/Ti, 55/45 which is originally a composition for giving a rhombohedral crystal structure, but can have a tetragonal crystal structure and be (001)-oriented.

In this way, the film structure body 10 shown in FIG. 1 is formed. Note that, after the piezoelectric film 14 is formed, the electroconductive film 15 may be formed on the piezoelectric film 14.

In addition, as described using FIG. 2 described above, the matching property between the lattice constant of $ZrO_2$ and the lattice constant of Si is good. Accordingly, the alignment film 12 containing $ZrO_2$ can be epitaxially grown on the main surface constituted of a (100) plane of the substrate 11 containing a silicon single crystal, and the alignment film 12 containing $ZrO_2$ can be (100)-oriented on a (100) plane of the substrate 11 containing a silicon single crystal, and the crystallinity of the alignment film 12 can be enhanced.

Furthermore, as described using FIG. 2 described above, the matching property between the lattice constant of Ni and the lattice constant of $ZrO_2$ is good. Consequently, the permanent magnet film 13 containing Ni can be epitaxially grown on the alignment film 12 containing $ZrO_2$, the permanent magnet film 13 containing Ni can be (100)-oriented on the (100) plane of the alignment film 12 containing $ZrO_2$, and the crystallinity of the permanent magnet film 13 can be enhanced.

Moreover, as described using FIG. 2 described above, the matching property between the lattice constant of PZT and the lattice constant of Ni is good. Accordingly, the piezoelectric film 14 containing PZT can be epitaxially grown on the permanent magnet film 13 containing Ni, the piezoelectric film 14 containing PZT can be (100)-oriented on a (100) plane of the permanent magnet film 13 containing Ni, and the crystallinity of the piezoelectric film 14 can be enhanced.

Modification of First Embodiment

In the first embodiment, the piezoelectric film 14 is directly formed on the permanent magnet film 13. However, the piezoelectric film 14 may be formed on the permanent magnet film 13 via an electroconductive film 13a (also referred to as a first electroconductive film). Such an example will be described as a modification of the first embodiment.

Figure 23:
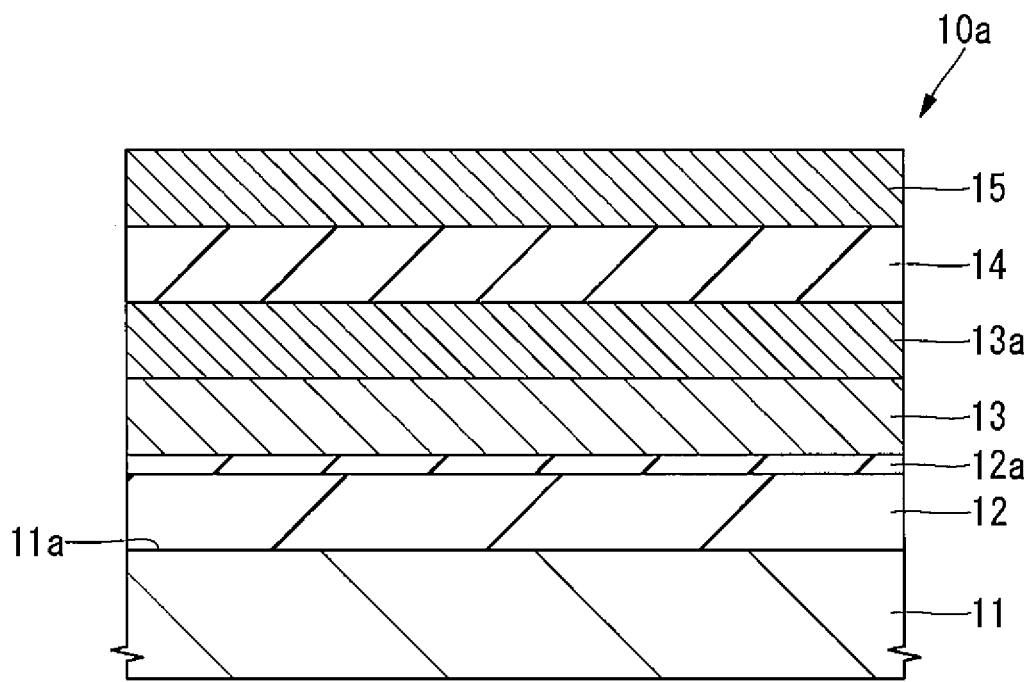
FIG. 23 is a cross-sectional view of a film structure body of a modification of the first embodiment.

FIG. 23 is a cross-sectional view of a film structure body of the modification of the first embodiment. As shown in FIG. 23, a film structure body 10a of the present modification has the substrate 11, the alignment film 12, the permanent magnet film 13, the electroconductive film 13a and the piezoelectric film 14.

The substrate 11 is formed of a silicon substrate. The alignment film 12 is epitaxially grown on the substrate 11, and contains zirconium and oxygen. Details of the substrate 11 and the orientation direction of the alignment film 12 or the like can be set to the same as those of the first embodiment.

The permanent magnet film 13 is epitaxially grown on the alignment film 12. As is the case for the first embodiment, a permanent magnet film containing a rare-earth element, that is, a permanent magnet film formed of a rare-earth magnet can be used as the permanent magnet film 13. Alternatively, a permanent magnet film other than a rare-earth magnet can be used as a permanent magnet film.

In FIG. 23, a case where the permanent magnet film 13 contains an Al—Ni—Co alloy will be exemplified and explained. Also at this time, in the same way as in the first embodiment, the permanent magnet film 13 suitably has a cubic crystal structure and is (100)-oriented. In an Al—Ni—Co alloy having a cubic crystal structure, since residual magnetization along the [100] direction is obtained, the residual magnetization of the permanent magnet film 13 can be further increased.

Here, a diffusion coefficient of Al in an Al—Ni—Co alloy is high. Accordingly, depending on conditions in forming the permanent magnet film 13 containing an Al—Ni—Co alloy, Al in the Al—Ni—Co alloy diffuses into the alignment film 12 containing $ZrO_2$, and a diffusion layer 12a containing alumina stabilized zirconia (ASZ) is formed, in an upper layer part of the alignment film 12. In the same way as YSZ, ASZ is cubic (100)-oriented easily as compared with $ZrO_2$. Accordingly, when the diffusion layer 12a is formed, the permanent magnet film 13 containing the Al—Ni—Co alloy is more easily cubic (100)-oriented as compared with a case where the diffusion layer 12a is not formed.

Note that cases other than the case where the permanent magnet film 13 contains an Al—Ni—Co alloy can be set to the same as that in the first embodiment, including the orientation direction or the like.

The electroconductive film 13a is epitaxially grown on the permanent magnet film 13. There can be used, as the electroconductive film 13a, the electroconductive film 13a containing at least one electroconductive substance selected from the group consisting of: electroconductive oxides having a perovskite-type structure such as strontium ruthenate ($SrRuO_3$); and metals such as Pt.

When the electroconductive film 13a contains $SrRuO_3$, suitably, the electroconductive film 13a has a cubic or pseudo-cubic crystal structure and is (100)-oriented. Furthermore, when the electroconductive film 13a contains Pt, suitably, the electroconductive film 13a has a cubic crystal structure and is (100)-oriented. For example, the piezoelectric film 14 containing PZT can be easily epitaxially grown on the electroconductive film 13a having a cubic crystal structure. Accordingly, the piezoelectric constant of the piezoelectric film 14 can be further increased.

The piezoelectric film 14 is epitaxially grown on the electroconductive film 13a. That is, the piezoelectric film is formed on the permanent magnet film 13 via the electroconductive film 13a. The piezoelectric film 14 may be set to the same as that in the first embodiment. Note that, in the same way as in the first embodiment, the electroconductive film 15 may be formed on the piezoelectric film 14.

According to the present modification, electric resistance of the lower electrode of the piezoelectric film 14 can be reduced, and the drop of a voltage applied to the piezoelectric film 14, from an intended voltage, can be prevented or suppressed. Furthermore, when an electroconductive film containing $SrRuO_3$ is used as the electroconductive film 13a, there can be prevented or suppressed deterioration of piezoelectric properties caused by precipitation of a hetero phase at the interface of the piezoelectric film 14 and the lower electrode of the piezoelectric film 14.

Figure 24:
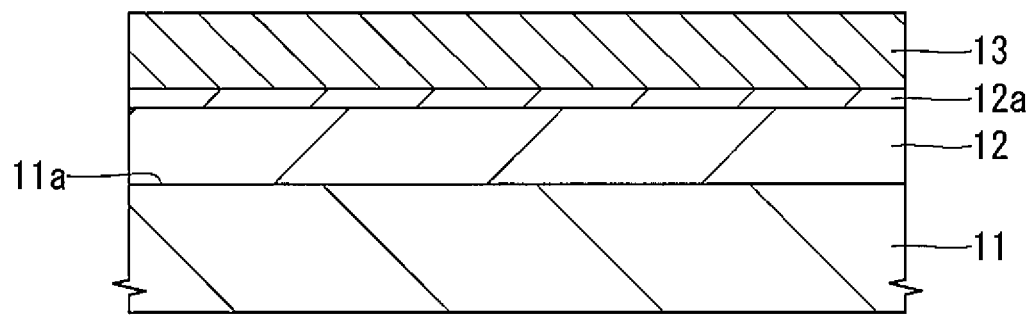
FIG. 24 is a cross-sectional view in a manufacturing process of the film structure body of the modification of the first embodiment.
Figure 25:
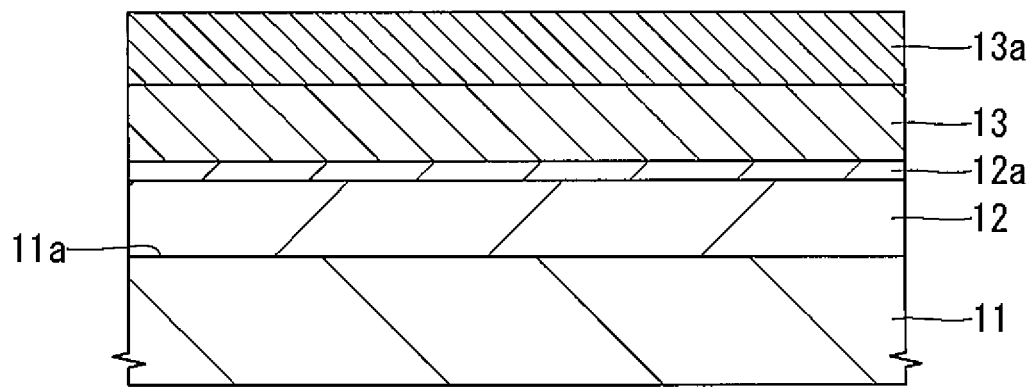
FIG. 25 is a cross-sectional view in a manufacturing process of the film structure body of the modification of the first embodiment.

FIGS. 24 and 25 are cross-sectional views in a manufacturing process of the film structure body of the modification of the first embodiment.

In the manufacturing process of the film structure body of the present modification, processes described in the first embodiment using FIGS. 19 and 20 (Step S1 and Step S2) are performed to thereby form the alignment film 12, and after that, as shown in FIG. 24, the permanent magnet film 13 is formed on the alignment film 12 by, for example, a sputtering method. Here, when the permanent magnet film 13 containing, for example, an Al—Ni—Co alloy is to be formed as the permanent magnet film 13, the diffusion layer 12a containing ASZ is formed in an upper layer part of the alignment film 12, by diffusion of Al in the Al—Ni—Co alloy into the alignment film 12 containing $ZrO_2$.

Next, as shown in FIG. 25, the electroconductive film 13a is formed on the permanent magnet film 13 by, for example, a sputtering method. There can be formed, as the electroconductive film 13a, the electroconductive film 13a containing at least one electroconductive substance selected from the group consisting of electroconductive oxides having a perovskite-type structure such as $SrRuO_3$ and metals such as Pt.

Subsequently, a process similar to the process described using FIG. 22 in the first embodiment (Step S4) is performed to thereby form the piezoelectric film 14 on the electroconductive film 13a as shown in FIG. 23. In this way, the film structure body 10a is formed. Note that the electroconductive film 15 may be formed on the piezoelectric film 14 in the same way as in the first embodiment.

Second Embodiment

In the first embodiment, a permanent magnet film is formed between the alignment film and the piezoelectric film. However, an electroconductive film may be formed between an alignment film and a piezoelectric film, and a permanent magnet film may be formed on the piezoelectric film. Such an example will be described as a second embodiment.

<Film Structure Body>

Figure 26:
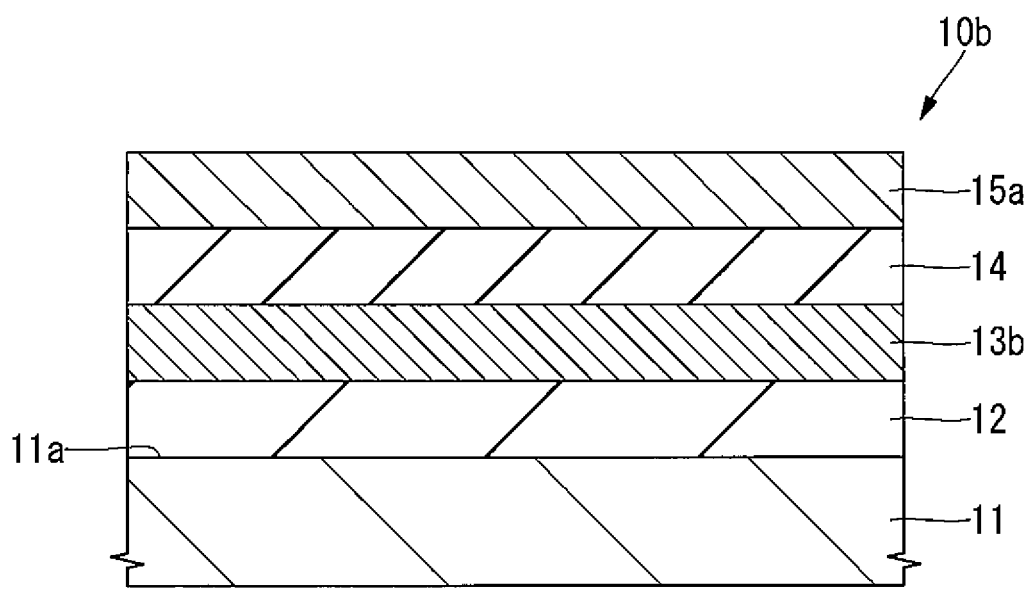
FIG. 26 is a cross-sectional view of a film structure body of a second embodiment.

FIG. 26 is a cross-sectional view of the film structure body of the second embodiment.

As shown in FIG. 26, a film structure body 10b of the second embodiment has the substrate 11, the alignment film 12, an electroconductive film 13b (also referred to as a first electroconductive film), the piezoelectric film 14, and the permanent magnet film 15a.

The substrate 11 is constituted of a silicon substrate. The alignment film 12 is epitaxially grown on the substrate 11, and contains zirconium and oxygen. Details of the substrate 11 and the alignment film 12, such as orientation direction can be set to the same as those in the first embodiment.

The electroconductive film 13b is epitaxially grown on the alignment film 12. There can be used, as the electroconductive film 13b, the electroconductive film 13b containing at least one electroconductive substance selected from the group consisting of: electroconductive oxides having a perovskite-type structure such as $SrRuO_3$; and metal such as Pt.

When the electroconductive film 13b contains $SrRuO_3$, suitably, the electroconductive film 13b has a cubic or pseudo-cubic crystal structure and is (100)-oriented. Furthermore, when the electroconductive film 13b contains Pt, suitably, the electroconductive film 13b has a cubic crystal structure and is (100)-oriented. For example, the piezoelectric film 14 containing PZT can be easily epitaxially grown on the electroconductive film 13b having a cubic crystal structure. Accordingly, the piezoelectric constant of the piezoelectric film 14 can be further increased.

The piezoelectric film 14 is epitaxially grown on the electroconductive film 13b. Details of the piezoelectric film 14, such as orientation direction, are set to the same as those in the first embodiment.

The permanent magnet film 15a is epitaxially grown on the piezoelectric film 14. There can be used, as the permanent magnet film 15a, a permanent magnet film containing a rare-earth element, that is, a permanent magnet film constituted of a rare-earth magnet, as is the case for the permanent magnet film 13 in the first embodiment. Alternatively, a permanent magnet film other than a rare-earth magnet can be used as a permanent magnet film. Furthermore, details of the permanent magnet film 15a such as orientation direction can be set to the same as those of the permanent magnet film 13 of the first embodiment.

Also in the second embodiment, in the same way as in the first embodiment, the piezoelectric film 14 and the permanent magnet film 15a are epitaxially grown. Accordingly, as compared with a case where the piezoelectric film 14 is not epitaxially grown, the piezoelectric constant of the piezoelectric film 14 can be increased, and as compared with a case where the permanent magnet film 15a is not epitaxially grown, the residual magnetization of the permanent magnet film 15a can be increased. In addition, the piezoelectric constant of the piezoelectric film 14 can be increased, and force which is received by the film structure body 10b and which is other than force by an inverse piezoelectric effect can be increased.

On the other hand, in the second embodiment, differently from the first embodiment, the electroconductive film 13b is formed between the alignment film 12 and the piezoelectric film 14. In the first embodiment, there are cases where the epitaxial growth is easily conducted when the lamination order is changed, depending on raw materials of the alignment film 12, the permanent magnet film 13, the piezoelectric film 14 and the electroconductive film 15. Alternatively, in the first embodiment, there are cases where it is preferable to form a permanent magnet film after, for example, performing heat treatment of the piezoelectric film 14 containing PZT, in order to prevent deterioration of the permanent magnet film 13 depending on a raw material of the permanent magnet film 13.

In such a case, as in the second embodiment, each of the layers is easily epitaxially grown by sequential lamination of the alignment film 12, the electroconductive film 13b, the piezoelectric film 14 and the permanent magnet film 15a. Alternatively, as in the second embodiment, it is possible to prevent deterioration of the permanent magnet film 15a by forming the permanent magnet film 15a after heat-treating the piezoelectric film 14.

<Actuator and Motor>

The film structure body 10b of the second embodiment, as described in the first embodiment using FIGS. 4 to 11, can also be applied to an actuator and a motor. Accordingly, the same effect as that of the actuator and the motor in the first embodiment can be obtained.

<Method for Manufacturing a Film Structure Body>

Figure 27:
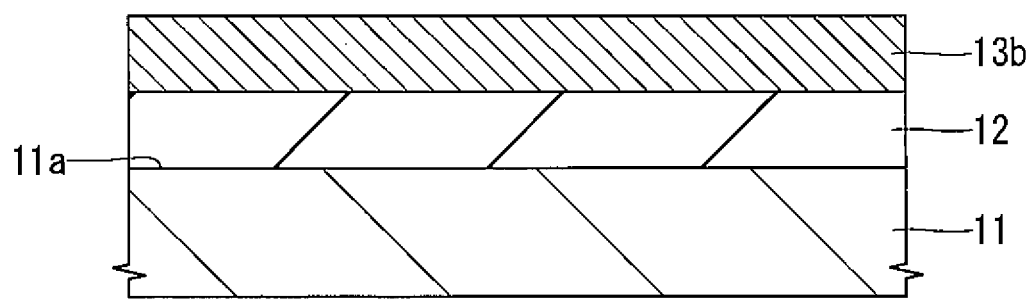
FIG. 27 is a cross-sectional view in a manufacturing process of the film structure body of the second embodiment.
Figure 28:
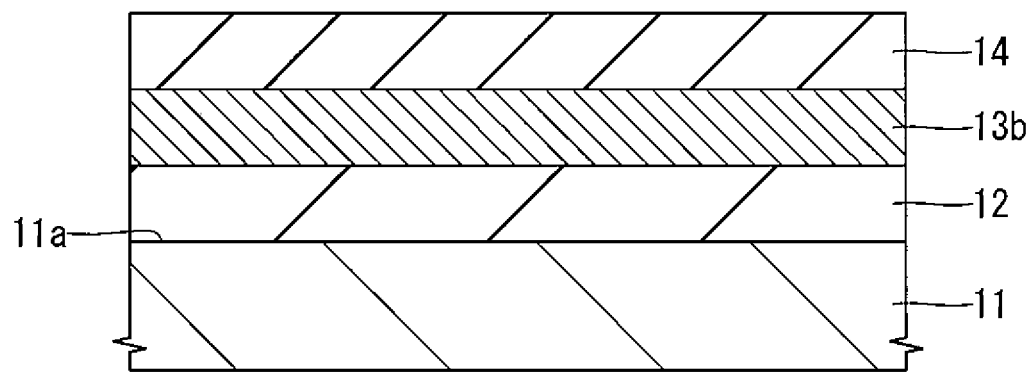
FIG. 28 is a cross-sectional view in a manufacturing process of the film structure body of the second embodiment.

FIGS. 27 and 28 are cross-sectional views in a manufacturing process of the film structure body of the second embodiment.

In the manufacturing process of the film structure body of the second embodiment, the alignment film 12 is formed by processes described through the use of FIGS. 19 and 20 in the first embodiment (Step S1 and Step S2), and after that, as shown in FIG. 27, the electroconductive film 13b is formed on the alignment film 12 by, for example, a sputtering method. There can be formed, as the electroconductive film 13b, the electroconductive film 13b containing one or more kinds of electroconductive substances selected from the group consisting of electroconductive oxides having a perovskite-type structure such as $SrRuO_3$, and metals such as Pt.

Next, the process similar to the process described through the use of FIG. 22 in the first embodiment (Step S4) is performed, and as shown in FIG. 28, the piezoelectric film 14 is formed on the electroconductive film 13b.

Subsequently, the process similar to the process described through the use of FIG. 20 in the first embodiment (Step S3) is performed, and as shown in FIG. 26, the permanent magnet film 13 is formed on the piezoelectric film 14 by, for example, a sputtering method. In this way, the film structure body 10b is formed.

Note that, in the first embodiment, the second embodiment and the modification, a PZT film is used as the piezoelectric film, but a piezoelectric film other than a PZT film may be used.

Example 1

A method for producing a sample in Example 1 is as follows.

First, Zr alone was deposited on a Si single crystal substrate (100)-oriented having a natural oxidation film on the surface, under conditions mentioned on the left-hand side of Table 1, (1) (film formation time: 10 sec, deposition source: Zr), and, successively, under conditions mentioned on the right-hand side of Table 1, (1), Zr deposition was performed along with supply of $O_2$ (oxygen) toward the substrate, for 170 sec as film formation time. In this way, $ZrO_2$ (100)/Si (100) substrate having 15 nm in the total film thickness was formed by a vacuum vapor deposition method.

Subsequently, Fe alone was deposited under conditions mentioned in Table 1, (2), and subsequently, Pt alone was deposited under conditions mentioned in Table 1, (3). Accordingly, a $Fe_{0.5}$—$Pt_{0.5}/ZrO_2$ structure was produced.

Figure 29:
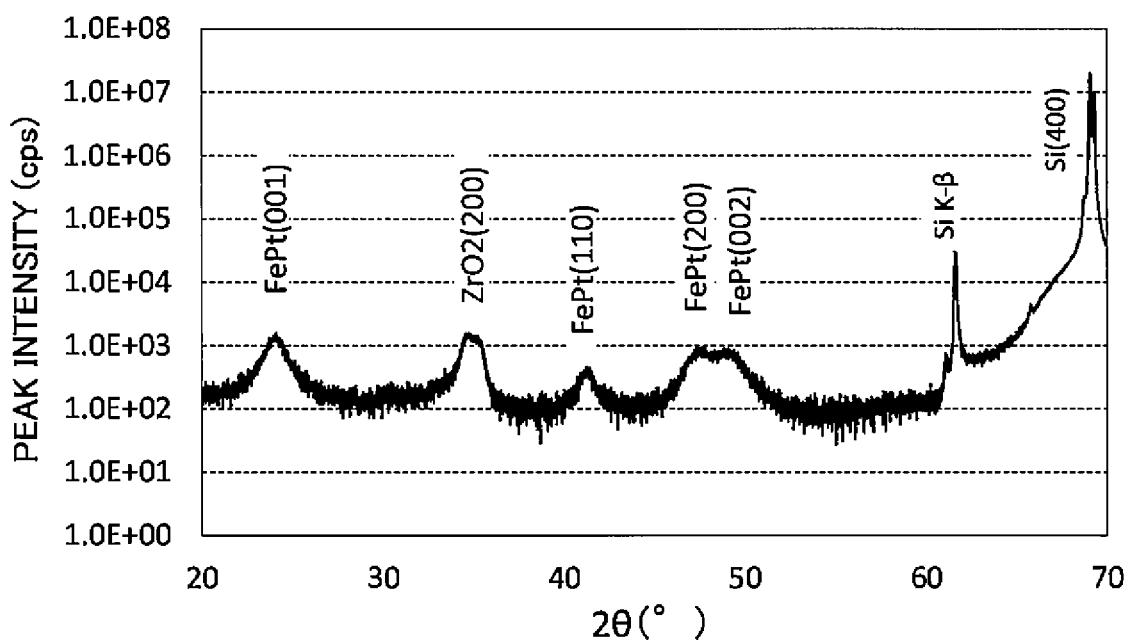
FIG. 29 is an XRD pattern of a sample in Example 1.

FIG. 29 shows an XRD (X-ray diffraction) pattern of the sample in Example 1. As can be seen from FIG. 29, a $Pt_{0.5}$—$Pt_{0.5}$ alloy known as a magnetic metal being oriented in (100) and (001), and having a thickness of 150 nm was able to be formed.

TABLE 1

| FILM STRUCTURE | Pt/Fe/ZrO2 | | |
|---|---|---|---|
| | ①ZrO2 | ②Fe | ③Pt |
| FILM DEPOSITION PRESSURE | 3.90E−04 | 1.30E−02 | 7.80E−04 | 6.10E−04 |
| DEPOSITION SOURCE | Zr | Zr + O2 | Fe | Pt |
| ACCELERATION VOLTAGE/EMISSION CURRENT | 7.5 kV/ 1.50 mA | 7.5 kV/ 1.80 mA | 6.0 mA | 2.2 mA |
| TOTAL FILM THICKNESS (nm) | 0.5 | 3 | 3 | 3 |
| FILM DEPOSITION TIME (sec) | 10 | 170 | 180 | 120 |
| FILM DEPOSITION SPEED (Å/S) | 0.03 | 0.06 | 0.16 | 0.23 |
| SUBSTRATE TEMPERATURE (° C.) | 600 | 500 | 450 | 450 |
| OXYGEN FLOW RATE | 0 | 5 sccm | 0 | 0 |

Example 2

A method for producing a sample in Example 2 is as follows.

First, Zr alone was deposited on a Si single crystal substrate (100)-oriented having a natural oxidation film on the surface, under conditions mentioned on the left-hand side of Table 1, (1) (film formation time: 10 sec, deposition source: Zr), and, successively, under conditions mentioned on the right-hand side of Table 1, (1), Zr deposition was performed along with supply of $O_2$ (oxygen) toward the substrate, for 170 sec as film formation time. In this way, $ZrO_2$ (100)/Si (100) substrate having 15 nm in the total film thickness was formed by a vacuum vapor deposition method.

Subsequently, Fe—Pt was vapor-deposited through the use of a Fe—Pt bath obtained by mixing of these at a weight ratio of 1:1 (25 g:25 g), under conditions mentioned in Table 1, (2). Accordingly, a $Fe_{0.96}$—$Pt_{0.04}$/$ZrO_2$ structure was produced.

Figure 30:
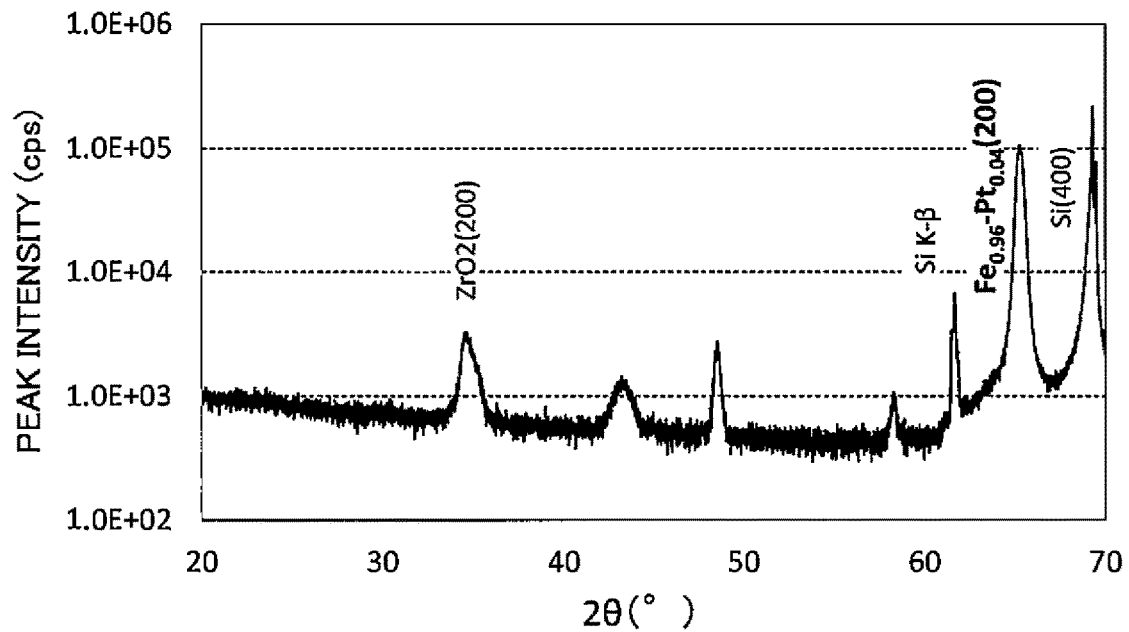
FIG. 30 is an XRD pattern of a sample in Example 2.
Figure 31:
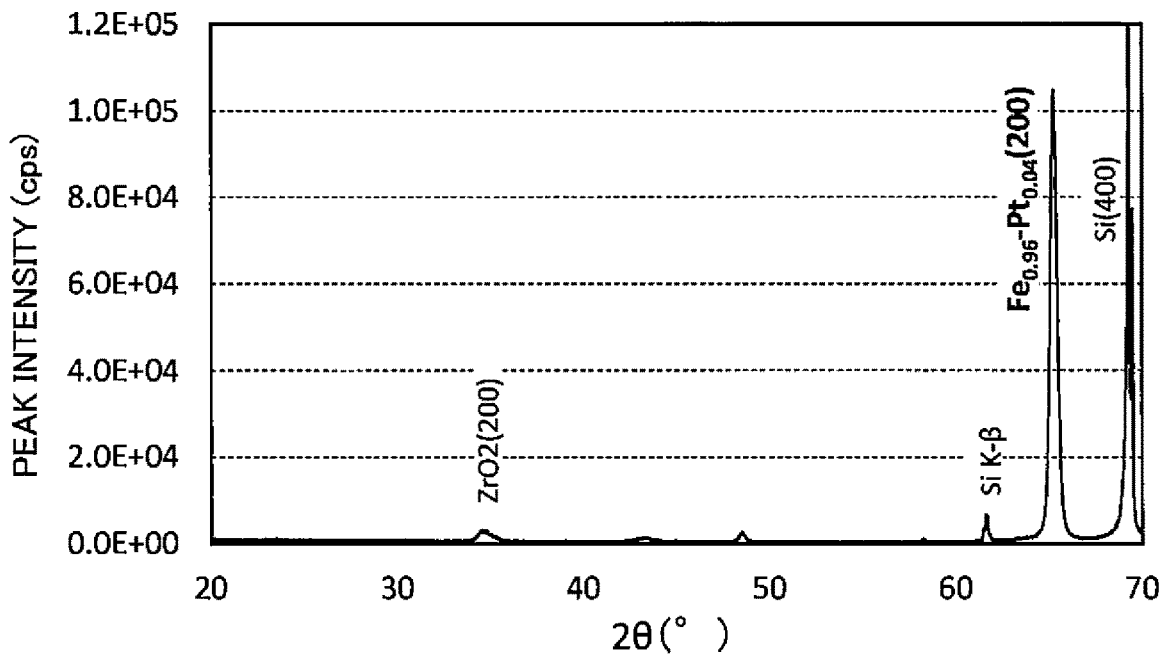
FIG. 31 is an XRD pattern of the sample in Example 2.

FIGS. 30 and 31 show XRD patterns of the sample in Example 2. As shown in FIGS. 30 and 31, an intense and single peak of $Fe_{0.95}$—$Pt_{0.04}$ was obtained, and the peak appeared at a position very close to that of Fe (200). The lattice constant of $Fe_{0.96}$—$Pt_{0.04}$ was 2.8 angstroms, and the lattice constant of a Fe atom was 2.88 angstroms, which was very close to 2.8 angstroms.

Then, a film thickness and composition of the sample in Example 2 were analyzed through the use of XRF (x-ray-fluorescence) (Rigaku Corporation, AZX400), and results mentioned in Table 3 were obtained. Accordingly, it was found that the sample obtained in Example 2 was a $Fe_{0.96}Pt_{0.04}$ alloy (200).

TABLE 2

| FILM STRUCTURE | Pt/Fe/ZrO2 | |
|---|---|---|
| | ①ZrO2 | ②Fe0.96—Pt0.04 |
| FILM DEPOSITION PRESSURE | 3.90E−04 | 1.30E−02 | 7.80E−04 |
| DEPOSITION SOURCE | Zr | Zr + O2 | Fe—Pt |
| ACCELERATION VOLTAGE/EMISSION CURRENT | 7.5 kV/ 1.50 mA | 7.5 kV/ 1.80 mA | 6.5 kV/ 6.0 mA |
| TOTAL FILM THICKNESS (nm) | 0.5 | 3 | 3 |
| FILM DEPOSITION TIME (sec) | 10 | 170 | 180 |
| FILM DEPOSITION SPEED (Å/S) | 0.03 | 0.06 | 0.16 |
| SUBSTRATE TEMPERATURE (° C.) | 600 | 500 | 450 |
| OXYGEN FLOW RATE | 0 | 5 sccm | 0 |

TABLE 3

| RESULTS OF XRF ANALYSIS | | |
|---|---|---|
| Fe—Pt ALLOY FILM THICKNESS (nm) | Fe at % | Pt at % |
| 143.84 | 95.56 | 4.44 |

Note that the above-described first embodiment, second embodiment, Example 1 and Example 2 can also be practiced by combination with each other within the scope of the ordinary creativity of a person skilled in the art.

Furthermore, in the first embodiment and the second embodiment, film structure bodies containing a substrate are described, but a film structure body not containing a substrate can also be practiced by removal of the substrate after production of the film structure body.

EXPLANATION OF SYMBOLS 10, 10a, 10b: film structure body
11: substrate
11a: upper surface
12: alignment film
12a: diffusion layer
12b: insulating film
13: ferromagnetic film (upper electrode, permanent magnet film)
13a, 13b, 15: electroconductive film
13c: ferromagnetic film
14: piezoelectric film
15: electroconductive film (ferromagnetic film, upper electrode)
15a: permanent magnet film
20: actuator
21: film structure body
21a, 22a: end part
21b, 22b: through-hole
22: ferromagnetic substance
23: holding part
24, 25: convex lens
26: light
27: focus position
30: magnetic head
31: rotation body
32: first actuator
33: second actuator
34: head
35: shaft
36: coil
37: permanent magnet
38, 39, 40: arm
38a, 38b, 39a, 39b, 40a, 40b: end part
41-44: film structure body 45: ferromagnetic substance
46: holding part
50: motor
51: rotatory part
52: stationary part
53: shaft
54, 55: film structure body
56: coil
60: car
61: engine
61a, 62a, 63a: power
62: motor
62b, 63b: electric power
63: generator
64: power transfer switching device
65: wheel
66: charge/discharge switching device
67: battery
101: rotor
102: stator
103: N-pole permanent magnet
104: S-pole permanent magnet
105: N-pole permanent magnet
106: S-pole permanent magnet
111: silicon substrate
112: alignment film
113: ferromagnetic film
114: piezoelectric film
115: ferromagnetic film (upper electrode)
116: opening part
117: arrow
151: rotatory part
152: stationary part
153: shaft
154: piezoelectric element

The invention claimed is:

1. An actuator, comprising:
a film structure body comprising a single crystal substrate, a first ferromagnetic film oriented and formed on said single crystal substrate, and a piezoelectric film formed on said first ferromagnetic film;
a ferromagnetic substance disposed on an opposite side of said piezoelectric film with said single crystal substrate therebetween, separately from said film structure body; and
a holding part that is connected to a first end part of said film structure body and a second end part of said ferromagnetic substance and holds a gap between said first end part and said second end part.

2. The actuator according to claim 1, further comprising a second ferromagnetic film or a second electroconductive film formed on said piezoelectric film.

3. The actuator according to claim 1, wherein said first ferromagnetic film has a tetragonal crystal structure and contains (001)-oriented $R_2Fe_{14}B$ where R is at least one element selected from rare-earth elements.

4. The actuator according to claim 1, wherein said first ferromagnetic film has a hexagonal crystal structure and contains (11-20)-oriented $RCo_4$ where R is at least one element selected from rare-earth elements.

5. The actuator according to claim 1, wherein said first ferromagnetic film contains an alloy of iron, nickel, cobalt and aluminum.

6. The actuator according to claim 1, wherein said first ferromagnetic film contains an alloy of iron and platinum.

7. The actuator according to claim 1, wherein said piezoelectric film has a tetragonal crystal structure and contains (001)-oriented lead zirconate titanate.

8. The actuator according to claim 1, wherein said piezoelectric film has a rhombohedral crystal structure and contains (100)-oriented lead zirconate titanate.

9. A motor comprising a rotatory part and a stationary part, wherein:
said rotatory part has a ring-shaped rotor, a first N-pole permanent magnet, a first S-pole permanent magnet, a second N-pole permanent magnet and a second S-pole permanent magnet which are disposed on an inside circumference of said rotor; and
said stationary part has a ring-shaped stator and a plurality of piezoelectric elements including a film structure body, disposed along on said stator,
said film structure body comprising:
a single crystal substrate;
a first ferromagnetic film oriented and formed on said single crystal substrate;
a piezoelectric film formed on said first ferromagnetic film; and
a second ferromagnetic film or an electroconductive film formed on said piezoelectric film.

10. The actuator according to claim 9, wherein said first ferromagnetic film has a tetragonal crystal structure and contains (001)-oriented $R_2Fe_{14}B$ where R is at least one element selected from rare-earth elements.

11. The actuator according to claim 9, wherein said first ferromagnetic film has a hexagonal crystal structure and contains (11-20)-oriented $RCo_5$ where R is at least one element selected from rare-earth elements.

12. The actuator according to claim 9, wherein said first ferromagnetic film contains an alloy of iron, nickel, cobalt and aluminum.

13. The actuator according to claim 9, wherein said first ferromagnetic film contains an alloy of iron and platinum.

14. The actuator according to claim 9, wherein said piezoelectric film has a tetragonal crystal structure and contains (001)-oriented lead zirconate titanate.

15. The actuator according to claim 9, wherein said piezoelectric film has a rhombohedral crystal structure and contains (100)-oriented lead zirconate titanate.

16. The actuator according to claim 9, wherein said electroconductive film has a cubic crystal structure and contains (100)-oriented platinum.

17. The film structure body according to claim 9, wherein said electroconductive film has a cubic crystal structure and contains (100)-oriented strontium ruthenate.

* * * * *